United States Patent
Kuroiwa et al.

(10) Patent No.: US 10,599,036 B2
(45) Date of Patent: Mar. 24, 2020

(54) CHEMICALLY AMPLIFIED POSITIVE-TYPE PHOTOSENSITIVE RESIN COMPOSITION

(71) Applicant: TOKYO OHKA KOGYO CO., LTD., Kawasaki-shi (JP)

(72) Inventors: Yasushi Kuroiwa, Kawasaki (JP); Yasuo Masuda, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/467,394

(22) Filed: Mar. 23, 2017

(65) Prior Publication Data

US 2017/0285476 A1  Oct. 5, 2017

(30) Foreign Application Priority Data

Mar. 31, 2016 (JP) .................. 2016-070982

(51) Int. Cl.
| | | |
|---|---|---|
| *G03F 7/039* | (2006.01) | |
| *G03F 7/30* | (2006.01) | |
| *G03F 7/20* | (2006.01) | |
| *G03F 7/32* | (2006.01) | |
| *C08F 220/18* | (2006.01) | |
| *G03F 7/004* | (2006.01) | |
| *G03F 7/16* | (2006.01) | |
| *G03F 7/38* | (2006.01) | |
| *G03F 7/40* | (2006.01) | |

(52) U.S. Cl.
CPC .......... *G03F 7/0392* (2013.01); *C08F 220/18* (2013.01); *G03F 7/0045* (2013.01); *G03F 7/162* (2013.01); *G03F 7/168* (2013.01); *G03F 7/2004* (2013.01); *G03F 7/30* (2013.01); *G03F 7/322* (2013.01); *G03F 7/38* (2013.01); *G03F 7/40* (2013.01); *C08F 2800/20* (2013.01)

(58) Field of Classification Search
CPC ............................... G03F 7/0392; G03F 7/322
USPC ............................................. 430/170–270.1
See application file for complete search history.

(56) References Cited

U.S. PATENT DOCUMENTS

| | | | | |
|---|---|---|---|---|
| 4,423,136 A | * | 12/1983 | Crivello ................ | C08F 291/18 430/281.1 |
| 5,861,231 A | * | 1/1999 | Barclay ................. | C08F 212/14 430/270.1 |
| 6,037,107 A | * | 3/2000 | Thackeray ............ | G03F 7/0045 430/326 |
| 6,338,936 B1 | * | 1/2002 | Ichikawa .............. | G03F 7/0392 430/280.1 |
| 6,989,224 B2 | * | 1/2006 | Adams .................. | G03F 7/0392 430/270.1 |
| 2001/0055726 A1 | * | 12/2001 | Kanna ................... | G03F 7/0045 430/270.1 |
| 2010/0182864 A1 | | 7/2010 | Ichimura | |
| 2015/0219993 A1 | * | 8/2015 | Ito .......................... | C08F 12/22 216/49 |
| 2017/0285476 A1 | * | 10/2017 | Kuroiwa ................ | G03F 7/322 |

FOREIGN PATENT DOCUMENTS

| | | |
|---|---|---|
| JP | H11-286535 A | 10/1999 |
| JP | 2000-029212 A | 1/2000 |
| JP | 2008-197222 A | 8/2008 |
| JP | 2008197222 A * | 8/2008 |
| JP | 2010-170612 | 8/2010 |

OTHER PUBLICATIONS

Frechet, "The photogeneration of acid and base within polymer coatings: Approaches to polymer curing and imaging", Pure & Appl. Chem., vol. 64, No. 9, pp. 1239-1248, 1992, Printed in Great Britain. copyright 1992 IUPAC (Year: 1992).*
Ito, "Chemcial amplication resists: History and Development within IBM", IBM J. RES. DEVELOP. vol. 44 No. 1/2 Jan./Mar. 2000, pp. 119-130. (Year: 2000).*
Notification of Reasons for Refusal issued in Japanese Patent Application No. 2016-070982, dated Nov. 5, 2019.

* cited by examiner

*Primary Examiner* — Cynthia Hamilton
(74) *Attorney, Agent, or Firm* — Knobbe, Martens, Olson & Bear LLP

(57) ABSTRACT

A chemically amplified positive-type photosensitive resin composition that can be well developed with an aqueous basic solution having low pH, a substrate with a photosensitive film formed from the composition, and a method for patterned resist film formation using the composition. The composition includes an acid generator that produces an acid upon irradiation with an active ray or radiation; a resin whose solubility in alkali increases under the action of acid; and an organic solvent, in which a predetermined amount of an alkali-soluble resin soluble in an aqueous basic solution having a pH of 12 and containing alkali-soluble groups with hydrogen atoms in at least a part thereof is substituted with an acid-dissociative dissolution-controlling group contained in the resin.

9 Claims, No Drawings

CHEMICALLY AMPLIFIED POSITIVE-TYPE PHOTOSENSITIVE RESIN COMPOSITION

This application claims priority to Japanese Patent Application No. 2016-070982, filed Mar. 31, 2016, the entire content of which is incorporated herein by reference.

BACKGROUND OF THE INVENTION

Field of the Invention

The present invention relates to a chemically amplified positive-type photosensitive resin composition, a substrate with a photosensitive film formed of the chemically amplified positive-type photosensitive resin composition, and a method for patterned resist film formation using the chemically amplified positive-type photosensitive resin composition.

Related Art

A method that includes mounting a plurality of IC chips on an interposer formed of silicon or glass such as silicon or glass and then mounting the interposer with the plurality of IC chips mounted thereon on a resin interposer has been studied as a method for the manufacture of multi-chip modules such as MCPs (multi-chip packages) and SiPs (system in packages).

This method, however, involves a problem, for example, that the interposer formed of silicon or glass is expensive and experiences difficulties in mounting IC chips. For this reason, the use of resin interposers also as interposers on which IC chips are mounted has been studied. In this case, a resist pattern should be formed on a resin interposer to form wirings or terminals formed of metals such as copper.

A commonly adopted method for the formation of a resist pattern in the formation of wirings or terminals on the resin substrate is a method in which a dry film formed of a negative-type photosensitive composition is used and development is carried out with an aqueous basic solution that is inexpensive and has low pH (for example, pH 12 or less). For example, an aqueous sodium carbonate solution is usable as the developing solution. However, the use of the negative-type photosensitive composition involves problems such as unsatisfactory resolution and difficulties in separating the resist pattern from the resin substrate.

A method that can solve the above problem includes a method for the formation of a resist pattern using a positive-type photosensitive composition that has good resolution and is relatively easy to be separated from the resin substrate. Examples of known positive-type photosensitive compositions usable for the formation of wirings or terminals formed of metals include photosensitive compositions comprising alkali-soluble novolak resins such as cresol novolak resins, photosensitizers, and benzotriazole compounds (see Patent Document 1).

Patent Document 1: Japanese Unexamined Patent Application, Publication No. 2010-170612

SUMMARY OF THE INVENTION

When replacement of a negative-type photosensitive composition with a positive-type photosensitive composition is taken into consideration, good resolution of a fine resist pattern is necessary even in development with an aqueous basic solution having low pH such as an aqueous sodium carbonate solution. In the positive-type photosensitive composition disclosed in Patent Document 1, however, resolution in the use of an aqueous basic solution having low pH as the developing solution is not always satisfactory.

The present invention has been made in view of the above problems, and an object of the present invention is to provide a chemically amplified positive-type photosensitive resin composition that can be well developed with an aqueous basic solution having low pH, a substrate with a photosensitive film formed of the chemically amplified positive-type photosensitive resin composition, and a method for patterned resist film formation using the chemically amplified positive-type photosensitive resin composition.

The present inventors have found that the above problems involved in a chemically amplified positive-type photosensitive resin composition comprising: an acid generator (A) that produces an acid by being irradiated with an active ray or radiation; a resin (B) whose solubility in alkali increases under the action of acid; and an organic solvent (S), can be solved by incorporating, into the resin (B), a predetermined amount of a first resin (B1) that is an alkali-soluble resin soluble in an aqueous basic solution having a pH value of 12 and containing alkali-soluble groups with hydrogen atoms in at least a part thereof being substituted by an acid-dissociative dissolution-controlling group. Specifically, the present invention provides the following matters.

According to a first aspect of the present invention, there is provided a chemically amplified positive-type photosensitive resin composition comprising:

an acid generator (A) that produces an acid by being irradiated with an active ray or radiation;

a resin (B) whose solubility in alkali increases under the action of acid; and an organic solvent (S), wherein the resin (B) contains a first resin (B1), the first resin (B1) is an alkali-soluble resin soluble in an aqueous basic solution having a pH value of 12 and containing alkali-soluble groups with hydrogen atoms in at least a part thereof being substituted by an acid-dissociative dissolution-controlling group, and the ratio of the mass of the first resin (B1) to the mass of the resin (B) is more than 50% by mass.

According to a second aspect of the present invention, there is provided a substrate with a photosensitive film, comprising: a substrate; and a photosensitive film formed of a chemically amplified positive-type photosensitive resin composition according to the first aspect of the invention and provided on the substrate.

According to a third aspect of the present invention, there is provided a method for patterned resist film formation, the method comprising:

subjecting a photosensitive film formed of a chemically amplified positive-type photosensitive resin composition according to the first aspect of the present invention to position-selective exposure; and developing the exposed photosensitive film.

The present invention can provide a chemically amplified positive-type photosensitive resin composition that can be well developed with an aqueous basic solution having low pH, a substrate with a photosensitive film formed of the chemically amplified positive-type photosensitive resin composition, and a method for patterned resist film formation using the chemically amplified positive-type photosensitive resin composition.

DETAILED DESCRIPTION OF THE INVENTION

<<Chemically Amplified Positive-Type Photosensitive Resin Composition>>

A chemically amplified positive-type photosensitive resin composition (hereinafter referred to also as a positive-type composition) comprises: an acid generator (A) that produces an acid by being irradiated with an active ray or radiation; a resin (B) whose solubility in alkali increases under the action of acid; and an organic solvent (S). The resin (B) contains a first resin (B1). The first resin (B1) is an alkali-soluble resin soluble in an aqueous basic solution having a pH value of 12 and containing alkali-soluble groups with hydrogen atoms in at least a part thereof being substituted by an acid-dissociative dissolution-controlling group. The ratio of the mass of the first resin (B1) to the mass of the resin (B) is more than 50% by mass. The positive-type composition can be well developed even with an aqueous basic solution having low pH when the positive-type composition contains a resin (B) containing a predetermined amount of a first resin (B1).

Indispensable or optional ingredients contained in the positive-type composition will be described.

<Acid Generator (A)>

The acid generator (A) is a compound that, when irradiated with an active ray or radiation, can produce an acid, and the acid generator (A) is not particularly limited as long as the compound directly or indirectly produces an acid under the action of light. Acid generators in first to fifth embodiments that will be described below are preferred as the acid generator (A). Examples of the acid generator (A) that is suitable in the positive-type composition will be described as the first to fifth embodiments.

Compounds represented by the following formula (a1) may be mentioned as the first embodiment in the acid generator (A).

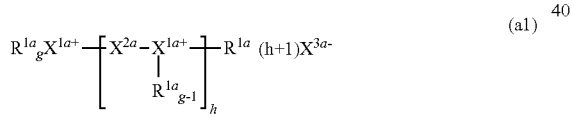
(a1)

In the formula (a1), $X^{1a}$ represents a sulfur atom or iodine atom having a valence of g; and g represents 1 or 2. h represents the number of repeating units in the structure within parentheses. $R^{1a}$ represents an organic group that is bonded to $X^{1a}$, and represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms, and $R^{1a}$ may be substituted by at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h(g−1)+1, and the $R^{1a}$s may be respectively identical to or different from each other. Furthermore, two or more $R^{1a}$s may be bonded to each other directly or via —O—, —S—, —SO—, —SO$_2$—, —NH—, —NR$^{2a}$—, —CO—, —COO—, —CONH—, an alkylene group having 1 to 3 carbon atoms, or a phenylene group, and may form a ring structure containing $X^{1a}$. $R^{2a}$ represents an alkyl group having 1 to 5 carbon atoms, or an aryl group having 6 to 10 carbon atoms.

$X^{2a}$ represents a structure represented by the following formula (a2).

(a2)

In the formula (a2) $X^{4a}$ represents an alkylene group having 1 to 8 carbon atoms, an arylene group having 6 to 20 carbon atoms, or a divalent group of a heterocyclic compound having 8 to 20 carbon atoms, and $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and halogen atoms. $X^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group.

h represents the number of repeating units of the structure in parentheses. $X^{4a}$s in the number of h+1 and $X^{5a}$s in the number of h may be identical to or different from each other. $R^{2a}$ is as defined above.

$X^{3a-}$ represents a counter ion of onium, and examples thereof include fluorinated alkylfluorophosphoric acid anions represented by the following formula (a17) or borate anions represented by the following formula (a18).

(a17)

In the formula (a17), $R^{3a}$ represents an alkyl group having 80% or more of the hydrogen atoms substituted by fluorine atoms. j represents the number of $R^{3a}$s and is an integer of 1 to 5. $R^{3a}$s in the number of j may be the same or different.

(a18)

In the formula (a18), $R^{4a}$ to $R^{7a}$ each independently represent a fluorine atom or a phenyl group, and a part or all of the hydrogen atoms of the phenyl group may be substituted by at least one selected from the group consisting of a fluorine atom and a trifluoromethyl group.

Examples of onium ions in the compound represented by the formula (a1) include triphenylsulfonium, tri-p-tolylsulfonium, 4-(phenylthio)phenyldiphenylsulfonium, bis[4-(diphenylsulfonio)phenyl] sulfide, bis[4-{bis[4-(2-hydroxyethoxy)phenyl]sulfonio}phenyl] sulfide, bis{4-[bis(4-fluorophenyl)sulfonio]phenyl}sulfide, 4-(4-benzoyl-2-chlorophenylthio)phenylbis(4-fluorophenyl)sulfonium, 7-isopropyl-9-oxo-10-thia-9,10-dihydroanthran-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio) phenyldiphenylsulfonium, diphenylphenacylsulfonium, 4-hydroxyphenylmethylbenzylsulfonium, 2-naphthylmethyl (1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

Among the onium ions in the compound represented by the formula (a1), a preferred onium ion may be a sulfonium ion represented by the following formula (a19).

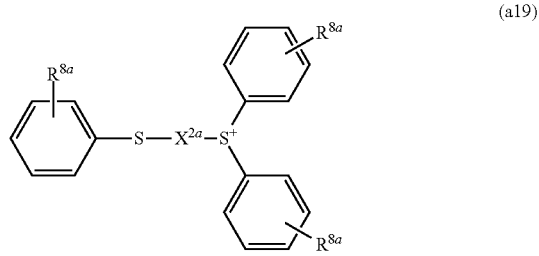

(a19)

In the formula (a19), $R^{8a}$s each independently represent a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in the formula (a1).

Specific examples of the sulfonium ion represented by the formula (a19) include 4-(phenylthio)phenyldiphenylsulfonium, 4-(4-benzoyl-2-chlorophenylthio)phenylbis(4-fluorophenyl) sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, and diphenyl[4-(p-terphenylthio)phenyl]diphenylsulfonium.

In fluorinated alkylfluorophosphoric acid anions represented by the formula (a17), $R^{3a}$ represents an alkyl group substituted by a fluorine atom, and the number of carbon atoms is preferably 1 to 8, further preferably 1 to 4. Specific examples of alkyl groups include linear alkyl groups such as methyl, ethyl, propyl, butyl, pentyl, and octyl; branched alkyl groups such as isopropyl, isobutyl, sec-butyl, and tert-butyl; and cycloalkyl groups such as cyclopropyl, cyclobutyl, cyclopentyl, and cyclohexyl, and the proportion of the alkyl group in which hydrogen atoms are substituted by a fluorine atom is generally not less than 80%, preferably not less than 90%, more preferably 100%. When the substitutional ratio of the fluorine atom is less than 80%, the acid strength of onium fluorinated alkylfluorophosphate represented by the formula (a1) is lowered.

A particularly preferred example of $R^{3a}$ is a linear or branched perfluoroalkyl group having 1 to 4 carbon atoms and a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. j which is the number of $R^{3a}$s represents an integer of 1 to 5, and is preferably 2 to 4, and particularly preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$ and $[(CF_3CF_2CF_2)_3PF_3]^-$. Among these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$ are particularly preferred.

Specific examples of preferred borate anions represented by the formula (a18) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), and tetrakis(difluorophenyl)borate ($[B(C_6H_3F_2)_4]^-$). Among these, tetrakis(pentafluorophenyl)borate ($[B(C_6F_5)_4]^-$) is particularly preferred.

The second embodiment of the acid generator (A) include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following formula (a3) such as tris(2,3-dibromopropyl)isocyanurate.

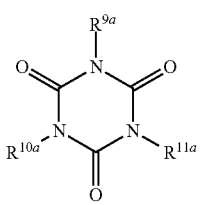

(a3)

In the formula (a3), $R^{9a}$, $R^{10a}$, and $R^{10a}$ each independently represent a halogenated alkyl group.

α-(p-Toluenesulfonyloxyimino)-phenylacetonitrile,
α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, α-(ethylsulfonyloxyimino)-1-cyclopentenylacetonitrile, and compounds containing an oxime sulfonate group and represented by the following formula (a4) may be mentioned as the third embodiment in the acid generator (A).

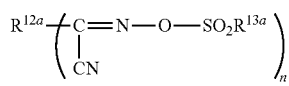

In the formula (a4), $R^{12a}$ represents a monovalent, bivalent or trivalent organic group, $R^{13a}$ represents a substituted or unsubstituted saturated hydrocarbon group, an unsaturated hydrocarbon group, or an aromatic compound group, and n represents the number of repeating units of the structure in the parentheses.

In the formula (a4), the aromatic compound group indicates a group of compounds having physical and chemical properties characteristic of aromatic compounds, and examples thereof include aryl groups such as a phenyl group and a naphthyl group, and heteroaryl groups such as a furyl group and a thienyl group may be exemplified. These may have one or more appropriate substituents such as halogen atoms, alkyl groups, alkoxy groups and nitro groups on the rings. $R^{13a}$ is particularly preferably an alkyl group having 1 to 6 carbon atoms such as a methyl group, an ethyl group, a propyl group, and a butyl group. In particular, compounds in which $R^{12a}$ represents an aromatic compound group, and $R^{13a}$ represents an alkyl group having 1 to 4 carbon atoms are preferred.

Examples of acid generators represented by the formula (a4), include compounds in which $R^{12a}$ is any one of a phenyl group, a methylphenyl group and a methoxyphenyl group, and $R^{13a}$ is a methyl group, provided that n is 1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene](o-tolyl)acetonitrile and the like. Provided that n is 2, the acid generator represented by the formula (a4) is specifically an acid generator represented by the following formulae.

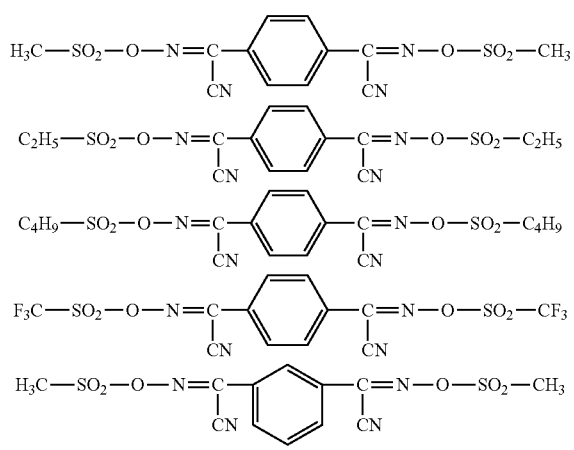

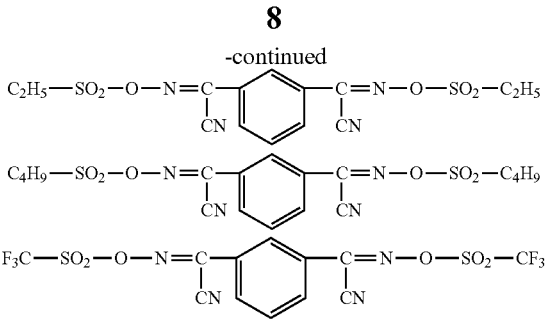

Onium salts having a naphthalene ring in a cation moiety thereof may be mentioned as the fourth embodiment in the acid generator (A). The expression "have a naphthalene ring" means having a naphthalene-derived structure and means that a structure of at least two rings and aromatic properties thereof are maintained. The naphthalene ring may have a substituent such as a linear or branched alkyl group having 1 to 6 carbon atoms, a hydroxyl group, or a linear or branched alkoxy group having 1 to 6 carbon atoms. The structure derived from the naphthalene ring may be of a monovalent group (one free valance) or of a bivalent (two free valences) or higher group, desirably of a monovalent group, provided that the number of free valances is counted except for the portions connected to the substituents described above. The number of naphthalene rings is preferably 1 to 3.

Preferably, the cation moiety in the onium salt having a naphthalene ring in the cation moiety has a structure represented by the following formula (a5).

In the formula (a5), at least one of $R^{14a}$, $R^{15a}$ and $R^{16a}$ represents a group represented by the following formula (a6), and the remaining represents a linear or branched alkyl group having 1 to 6 carbon atoms, an optionally substituted phenyl group, a hydroxyl group, or a linear or branched alkoxy group having 1 to 6 carbon atoms. Alternatively, one of $R^{14a}$, $R^{15a}$, and $R^{16a}$ is a group represented by the following formula (a6), and the remaining two are each independently a linear or branched alkylene group having 1 to 6 carbon atoms, provided that these terminals may bond to form a ring structure.

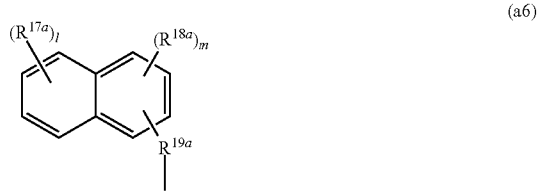

In the formula (a6), $R^{17a}$ and $R^{18a}$ each independently represent a hydroxyl group, a linear or branched alkoxy group having 1 to 6 carbon atoms, or a linear or branched alkyl group having 1 to 6 carbon atoms, and $R^{19a}$ represents a single bond or a linear or branched alkylene group having 1 to 6 carbon atoms that may have a substituent.

l and m each independently represent an integer of 0 to 2, and l+m is 3 or less. In this regard, when a plurality of $R^{17a}$ are present, they may be the same or different. Furthermore, when a plurality of $R^{18a}$ are present, they may be the same or different.

The number of groups represented by the formula (a6) among $R^{14a}$, $R^{15a}$ and $R^{16a}$ is preferably one from the view point of stability of the compound, and the remaining is a linear or branched alkylene group having 1 to 6 carbon atoms, provided that these terminals may bond to form a ring structure. In this regard, the two alkylene groups constitute a three- to nine-membered ring including sulfur atom(s). The number of atoms to form the ring (including sulfur atom(s)) is preferably 5 or 6.

Examples of substituents optionally possessed by the alkylene group include an oxygen atom (in this case, the oxygen atom together with a carbonyl group constituting the alkylene group forms a carbonyl group) and a hydroxyl group.

Examples of substituents optionally possessed by the phenyl group include a hydroxyl group, linear or branched alkoxy groups having 1 to 6 carbon atoms, and linear or branched alkyl groups having 1 to 6 carbon atoms.

Examples of suitable cation moieties include those represented by the following formulae (a7) and (a8). Particularly preferred are those represented by the following formula (a8).

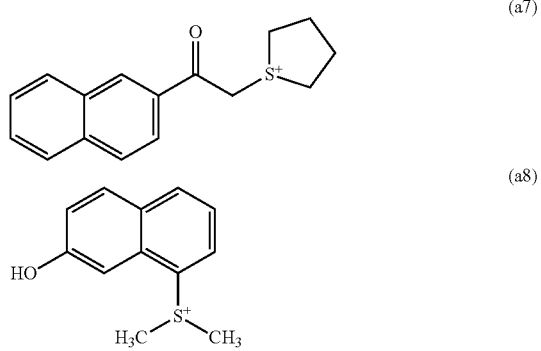

The cation moiety may be an iodonium salt or a sulfonium salt but is preferably a sulfonium salt, for example, from the viewpoint of acid generation efficiency.

Accordingly, anions that can form a sulfonium salt are preferred as a suitable anion moiety in the onium salt having a naphthalene ring in the cation moiety.

Fluoroalkylsulfonic acid ions or arylsulfonic acid ions in which a part or the whole of hydrogen atoms have been fluorinated may be mentioned as such anion moieties in the acid generator.

The alkyl group in the fluoroalkylsulfonic acid ions may be a linear, branched or cyclic alkyl group having 1 to 20 carbon atoms. Preferably, the number of carbon atoms is preferably 1 to 10 from the viewpoint of bulkiness and diffusion distance of the produced acid. Branched or cyclic alkyl groups are particularly preferred because the diffusion distance is small. Methyl, ethyl, propyl, butyl, octyl groups and the like are preferred because the product can be inexpensively synthesized.

The aryl group of the aryl sulfonic acid ions may be an aryl group having 6 to 20 carbon atoms, and examples thereof include phenyl and naphthyl groups that are substituted or unsubstituted by an alkyl group or a halogen atom. Aryl groups having 6 to 10 carbon atoms are particularly preferred because the product can be synthesized inexpensively. Specific examples of preferred aryl groups include phenyl, toluenesulfonyl, ethylphenyl, naphthyl, and methylnaphthyl groups.

When hydrogen atoms in the fluoroalkylsulfonic acid ion or the aryl sulfonic acid ion are partially or entirely substituted by a fluorine atom, the percentage fluorination is preferably 10% to 100%, more preferably 50% to 100%. Substitution of all the hydrogen atoms by a fluorine atom is particularly preferred from the viewpoint of increased acid strength. Specific examples thereof include trifluoromethane sulfonate, perfluorobutane sulfonate, perfluorooctane sulfonate, and perfluorobenzene sulfonate.

Among these, those represented by the following formula (a9) are preferred as the anion moiety.

$$R^{20a}SO_3^- \quad (a9)$$

In the formula (a9), $R^{20a}$ represents a group represented by the following formula (a10) or (a11), or a group represented by the following formula (a12).

In the formula (a10), x represents an integer of 1 to 4. In the formula (a11), $R^{21a}$ represents a hydrogen atom, a hydroxyl group, a linear or branched alkyl group having 1 to 6 carbon atoms, or a linear or branched alkoxy group having 1 to 6 carbon atoms, and y represents an integer of 1 to 3. Among them, trifluoromethane sulfonate and perfluorobutane sulfonate are preferred from the viewpoint of safety.

A nitrogen-containing moiety represented by the following formula (a13) or (a14) may also be used as the anion moiety.

In the formulae (a13) and (a14), $X^a$ represents a linear or branched alkylene group of which at least one hydrogen atom is substituted by a fluorine atom, and the number of carbon atoms in the alkylene group is 2 to 6, preferably 3 to 5, most preferably 3. In addition, $Y^a$ and $Z^a$ each independently represent a linear or branched alkyl group of which at least one hydrogen atom is substituted by a fluorine atom, and the number of carbon atoms in the alkyl group is 1 to 10, preferably 1 to 7, more preferably 1 to 3.

The number of carbon atoms in the alkylene group of $X^a$, or in the alkyl group of $Y^a$ or $Z^a$ is preferably small, because the smaller the number carbon atoms in the alkylene group of $X^a$, or in the alkyl group of $Y^a$ or $Z^a$, the better the solubility in organic solvents.

Further, the number of hydrogen atoms substituted by a fluorine atom in the alkylene group of $X^a$, or in the alkyl group of $Y^a$ or $Z^a$ is preferably large, because the larger the number of hydrogen atoms substituted by a fluorine atom in the alkylene group of $X^a$, or in the alkyl group of $Y^a$ or $Z^a$, the larger the acid strength. The proportion of fluorine atoms in the alkylene group or alkyl group, i.e., the percentage fluorination is preferably 70 to 100%, more preferably 90 to 100%. Perfluoroalkylene or perfluoroalkyl groups in which all the hydrogen atoms are substituted by a fluorine atom is most preferred.

Compounds represented by the following formulae (a15) and (a16) may be mentioned as preferred onium salts having a naphthalene ring in the cation moiety.

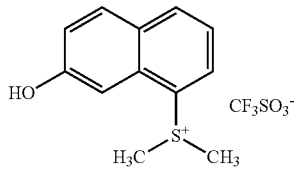

(a15)

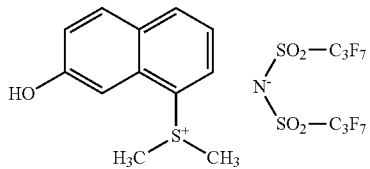

(a16)

The following compounds may be mentioned as the fifth embodiment in the acid generator (A): bissulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; trifluoromethane sulfonates such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate and (p-tert-butylphenyl) diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates and the like.

The acid generator (A) may be used solely or in a combination of two or more of them. The content of the acid generator (A) is preferably adjusted to 0.1% to 10% by mass, more preferably 0.5% to 3% by mass, relative to the total mass of the photosensitive resin composition. When the amount of the acid generator (A) used is in the above-defined range, it is easy to prepare positive-type compositions having a good sensitivity, being a homogeneous solution, and having an excellent storage stability.

<Resin (B)>

The resin (B) is a resin whose alkali solubility increases by the action of an acid. The resin (B) contains a first resin (B1) that is an alkali-soluble resin soluble in an aqueous basic solution having a pH value of 12 and containing alkali-soluble groups with hydrogen atoms in at least a part thereof being substituted by an acid-dissociative dissolution-controlling group. The ratio of the mass of the first resin (B1) to the mass of the resin (B) is more than 50% by mass, preferably not less than 55% by mass, more preferably not less than 60% by mass. When the positive-type composition contains the resin (B), good development with an aqueous basic solution having a pH value of not more than 12 is possible.

The expression "the alkali-soluble resin is soluble in an aqueous basic solution having a pH value of 12" refers to the case where, when a 1 μm-thick resin film is formed on a substrate using a resin solution having a resin concentration of 20% by mass (solvent: propylene glycol monomethyl ether acetate) and is immersed in an aqueous basic solution having pH 12 (20 to 30° C.) for one min, a thickness of not less than 0.1 μm is dissolved.

The resin (B) preferably contains a second resin (B2) in addition to the first resin (B1). The second resin (B2) is an alkali-soluble resin insoluble in an aqueous basic solution having a pH value of 13 but soluble in an aqueous basic solution having a pH value of more than 13 and containing alkali-soluble groups with hydrogen atoms in at least a part thereof being substituted by an acid-dissociative dissolution-controlling group.

The expression "the alkali-soluble resin is insoluble in an aqueous basic solution having a pH value of 13" refers to the case where, when a 1 μm-thick resin film is formed on a substrate using a resin solution having a resin concentration of 20% by mass (solvent: propylene glycol monomethyl ether acetate) and is immersed in an aqueous basic solution having a pH value of 13 (20 to 30° C.) for one min, only a thickness of less than 0.1 μm is dissolved. The expression "the alkali-soluble resin is soluble in an aqueous basic solution having a pH value of more than 13" refers to the case where, when a 1 μm-thick resin film is formed on a substrate using a resin solution having a resin concentration of 20% by mass (solvent: propylene glycol monomethyl ether acetate) and is immersed in an aqueous basic solution having a pH value of 13 (20 to 30° C.) for one min, a thickness of not less than 0.1 μm is dissolved. The expression "the alkali-soluble resin is soluble in an aqueous basic solution having a pH value of more than 13" does not mean that the alkali-soluble resin is soluble in aqueous basic solutions having any pH value of more than 13. The expression "the alkali-soluble resin is soluble in an aqueous basic solution having a pH value of more than 13" means that, in a process of gradually increasing the pH value of an aqueous basic solution after mixing of an alkali-soluble rein with an aqueous basic solution having a pH value of 13, for example, when the pH value reaches a specific pH value of more than 13, for example, a pH value of 13.5 or 14, the alkali-soluble resin is solubilized in the aqueous basic solution.

When the resin (B) contains the second resin (B2), even in development with an aqueous basic solution having low pH, a fine resist pattern having such a good shape that the side wall of the resist portion is perpendicular or substantially perpendicular to the substrate can easily be formed while suppressing the occurrence of scum.

The ratio of the total of the mass of the first resin (B1) and the mass of the second resin (B2) to the mass of the resin (B) is preferably not less than 80% by mass, more preferably not less than 90% by mass, particularly preferably 100% by mass. When the resin (B) contains the second resin (B2), the content of the second resin (B2) in the resin (B) is preferably 1 to 45% by mass, more preferably 5 to 40% by mass.

In the resin (B1) and the resin (B2), the ratio of the amount of alkali-soluble groups protected by an acid-dissociative dissolution-controlling group to the total of the amount of the alkali-soluble group and the amount of the amount of alkali-soluble groups protected by an acid-dissociative dissolution-controlling group is preferably 20 to 50% by mole, more preferably 20 to 30% by mole.

Novolak resins (B-a), polyhydroxystyrene resins (B-b), and acrylic resins (B-c) will be described as examples of suitable resin (B).

[Novolak Resin (B-a)]

The novolak resin (B-a) contains a novolak resin (B1-a) that is a novolak resin soluble in an aqueous basic solution having a pH value of 12 and containing phenolic hydroxyl groups with hydrogen atoms in at least a part thereof being substituted by an acid-dissociative dissolution-controlling group. When the positive-type composition contains the novolak resin (B-a) as the resin (B), the ratio of the mass of the novolak resin (B1-a) to the mass of the novolak resin (B-a) is more than 50% by mass.

Groups represented by the following formulae (b1) and (b2), linear, branched, or cyclic alkyl groups having 1 to 6 carbon atoms, vinyloxyethyl groups, tetrahydropyranyl groups, tetrafuranyl groups, and trialkylsilyl groups are preferred as the acid-dissociative dissolution-controlling group.

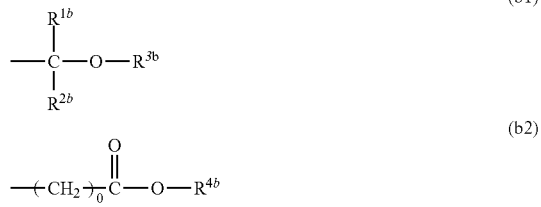

In the formulae (b1) and (b2), $R^{1b}$ and $R^{2b}$ each independently represent a hydrogen atom, or a linear or branched alkyl group having 1 to 6 carbon atoms, $R^{3b}$ represents a linear, branched or cyclic alkyl group having 1 to 10 carbon atoms, $R^{4b}$ represents a linear, branched or cyclic alkyl group having 1 to 6 carbon atoms, and o represents 0 or 1.

Examples of linear or branched alkyl groups include a methyl group, an ethyl group, a propyl group, an isopropyl group, an n-butyl group, an isobutyl group, a tert-butyl group, a pentyl group, an isopentyl group, and a neopentyl group. Further, examples of cyclic alkyl groups include a cyclopentyl group and a cyclohexyl group.

Specific examples of acid-dissociative dissolution-controlling groups represented by the formula (b1) include a methoxyethyl group, an ethoxyethyl group, a n-propoxyethyl group, an isopropoxyethyl group, a n-butoxyethyl group, an isobutoxyethyl group, a tert-butoxyethyl group, a cyclohexyloxyethyl group, a methoxypropyl group, an ethoxypropyl group, a 1-methoxy-1-methyl-ethyl group, and a 1-ethoxy-1-methylethyl group. Specific examples of acid-dissociative dissolution-controlling groups represented by the formula (b2) include a tert-butoxycarbonyl group and a tert-butoxycarbonylmethyl group. Examples of trialkylsilyl groups include a trimethylsilyl group and tri-tert-butyldimethylsilyl group in which each alkyl group has 1 to 6 carbon atoms.

The mass average molecular weight (Mw) of the novolak resin (B1-a) in terms of polystyrene is preferably 1,000 to 30,000, more preferably 3,000 to 20,000, because, when the positive-type composition is exposed to light, the exposed area is easily dissolved in an aqueous basic solution having low pH. The dispersivity of the novolak resin (B1-a) (mass average molecular weight (Mw)/number average molecular weight (Mn)) is preferably 2 to 20, more preferably 3 to 15.

The novolak resin (B-a) may contain a novolak resin (B2-a) as the second resin (B2) in addition to the novolak resin (B1-a) as the first resin (B1). The novolak resin (B2-a) is a resin that is insoluble in an aqueous basic solution having a pH value of 13 but soluble in an aqueous basic solution having a pH value of more than 13 and containing phenolic hydroxyl groups with hydrogen atoms in at least a part thereof being substituted by an acid-dissociative dissolution-controlling group.

The mass average molecular weight (Mw) of the novolak resin (B2-a) in terms of polystyrene is preferably 500 to 30,000, more preferably 1,000 to 20,000, because a resist pattern having a good shape can easily be formed.

The novolak resin (B-a) may contain a novolak resin that is neither the novolak resin (B1-a) nor the novolak resin (B2-a).

The novolak resin (B1-a) and the novolak resin (B2-a) may be produced by any method without particular limitation. Novolak resins such as the novolak resin (B1-a) and the novolak resin (B2-a) are generally produced by conducting a condensation reaction using 0.5 to 1.0 mole of a condensing agent, for example, an aldehyde compound, relative to one mole of a phenol compound in the presence of an acidic catalyst to obtain an unprotected novolak resin and then protecting phenolic hydroxyl groups contained in the novolak resin by an acid-dissociative dissolution-controlling group according to an ordinary method.

The unprotected novolak resin that is an intermediate of the novolak resin (B1-a) is prepared using a phenol compound containing a desired amount of phenol. The unprotected novolak resin that is an intermediate of the novolak resin (B2-a) is prepared using a phenol compound containing a desired amount of an alkylphenol.

Examples of phenol compounds include phenol and cresols such as o-cresol, m-cresol, and p-cresol; xylenols such as 2,3-xylenol, 2,4-xylenol, 2,5-xylenol, 2,6-xylenol, 3,4-xylenol, 3,5-xylenol; ethylphenols such as o-ethylphenol, m-ethylphenol, and p-ethylphenol; alkylphenols such as 2-isopropylphenol, 3-isopropylphenol, 4-isopropylphenol, o-butylphenol, m-butylphenol, p-butylphenol, and p-tert-butylphenol; trialkylphenols such as 2,3,5-trimethylphenol and 3,4,5-trimethylphenol; polyhydric phenol compounds such as resorcinol, catechol, hydroquinone, hydroquinone monomethyl ether, pyrogallol, and fluoroglucinol (all the alkyl groups having 1 to 4 carbon atoms), α-naphthol, β-naphthol, hydroxydiphenyl, and bisphenol A. These phenol compounds may be used solely or in a combination of two or more of them.

Aldehyde compounds and ketone compounds may be mentioned as the condensing agent. Aldehyde compounds, particularly formaldehyde and paraformaldehyde are preferred.

The acidic catalyst is not particularly limited, and examples of acidic catalysts include inorganic acids such as hydrochloric acid, sulfuric acid, nitric acid, phosphoric acid, and phosphonic acid; and organic acids such as formic acid, oxalic acid, acetic acid, diethyl sulfate, and paratoluenesulfonic acid; and metal salts such as zinc acetate. These acid catalysts may be used solely or in a combination of two or more of them.

The unprotected novolak resin that is an intermediate of the novolak resin (B1-a) is prepared, for example, using a phenol compound containing phenol in such an amount that the content of phenol-derived units in the unprotected novolak resin is not less than 50% by mass. The content of phenol-derived units in the unprotected novolak resin that is an intermediate of the novolak resin (B1-a) is preferably not less than 60% by mass, more preferably not less than 70% by mass, still more preferably not less than 80% by mass, particularly preferably not less than 90% by mass, most preferably 100% by mass. That is, most preferably, the unprotected novolak resin that is an intermediate of the novolak resin (B1-a) consists of phenol-derived units only.

For example, o-cresol, m-cresol, p-cresol, resorcinol, catechol, hydroquinone, hydroquinone monomethyl ether, pyrogallol, and fluoroglucinol are preferred as compounds that are other than phenol and may be contained in phenol compounds for use in the preparation of unprotected novolak resins that are intermediates of the novolak resin (B1-a) because positive-type compositions that can be well developed with a basic developing solution having low pH can easily be obtained.

The unprotected novolak resin that is an intermediate of the novolak resin (B2-a) is prepared using a phenol compound containing an alkylphenol. Alkylphenols include o-cresol, m-cresol, p-cresol, 2,3-xylenol, 2,4-xylenol, 2,5-xylenol, 2,6-xylenol, 3,4-xylenol, 3,5-xylenol, o-ethylphenol, m-ethylphenol, p-ethylphenol, 2-isopropylphenol, 3-isopropylphenol, 4-isopropylphenol, o-butylphenol, m-butylphenol, p-butylphenol, p-tert-butylphenol, 2,3,5-trimethylphenol, and 3,4,5-trimethylphenol. The phenol compound used in the preparation of the unprotected novolak resin that is an intermediate of the novolak resin (B2-a) may contain two or more alkylphenols in combination. The content of the alkylphenol in the phenol compound used in the preparation of the unprotected novolak resin that is an intermediate of the novolak resin (B2-a) is determined depending upon the type of the alkylphenol so that an unprotected novolak resin having a desired solubility in an aqueous basic solution having a pH value of more than 13 is obtained. Typically, the content of alkylphenol-derived units in the unprotected novolak resin that is an intermediate of the novolak resin (B2-a) is preferably not less than 50% by mass, more preferably not less than 70% by mass, particularly preferably not less than 90% by mass, most preferably 100% by mass.

Among alkylphenols, m-cresol and p-cresol are preferred, and combined use of m-cresol and p-cresol is more preferred. The unprotected novolak resin that is an intermediate of the novolak resin (B2-a) is preferably a resin prepared using a phenol compound that is a mixture composed of m-cresol and p-cresol. When the unprotected novolak resin that is an intermediate of the novolak resin (B2-a) is prepared using a phenol compound containing m-cresol and p-cresol, the mixing ratio between m-cresol and p-cresol is not particularly limited but is preferably m-cresol/p-cresol=3/7 to 8/2 (mass ratio).

[Polyhydroxystyrene Resin (B-b)]

The polyhydroxystyrene resin (B-b) contains a polyhydroxystyrene resin (B1-b) that is a polyhydroxystyrene resin soluble in an aqueous basic solution having a pH value of 12 and containing alkali-soluble groups such as phenolic hydroxyl groups with hydrogen atoms in at least a part thereof being substituted by an acid-dissociative dissolution-controlling group. The ratio of the mass of the polyhydroxystyrene resin (B1-b) to the mass of the polyhydroxystyrene resin (B-b) is more than 50% by mass.

The solubility of the unprotected polyhydroxystyrene resin that is an intermediate of the polyhydroxystyrene resin (B1-b) in an aqueous basic solution can be regulated by regulating the content of units derived from hydroxystyrene compounds, regulating the molecular weight, or copolymerizing a hydroxystyrene compound and a carboxy group-containing monomer.

Examples of carboxy group-containing monomers include, for example, monocarboxylic acid compounds such as acrylic acid, methacrylic acid, and crotonic acid; dicarboxylic acids such as maleic acid, fumaric acid, and itaconic acid; and methacrylic acid derivatives containing a carboxy group and an ester bond, such as 2-methacryloyloxyethylsuccinic acid, 2-methacryloyloxyethylmaleic acid, 2-methacryloyloxyethylphthalic acid, and 2-methacryloyloxyethylhexahydrophthalic acid.

Units represented by the following formula (b3) may be mentioned as examples of suitable units that are derived from hydroxystyrene compounds and contained in the unprotected polyhydroxystyrene resin that is an intermediate of the polyhydroxystyrene resin (B1-b).

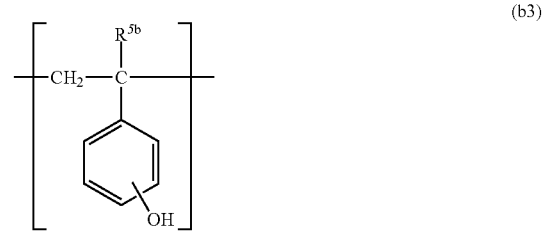

(b3)

In the formula (b3), $R^{5b}$ represents a hydrogen atom or an alkyl group having 1 to 6 carbon atoms.

Examples of alkyl groups having 1 to 6 carbon atoms include linear, branched, or cyclic alkyl groups having 1 to 6 carbon atoms. Examples of linear or branched alkyl groups include a methyl group, an ethyl group, a propyl group, an isopropyl group, an n-butyl group, an isobutyl group, a tert-butyl group, a pentyl group, an isopentyl group, a neopentyl group, and the like. Examples of cyclic alkyl groups include a cyclopentyl group, a cyclohexyl group, and the like.

The unprotected polyhydroxystyrene resin that is an intermediate of the polyhydroxystyrene resin (B1-b) may contain constituent units derived from other polymerizable compounds from the viewpoint of properly regulating physical and chemical properties. Such polymerizable compounds include publicly known radical polymerizable compounds and anionic polymerizable compounds. Such polymerizable compounds include, for example, (meth)acrylic acid alkyl esters such as methyl (meth)acrylate, ethyl (meth)acrylate, and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyl toluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

The polyhydroxystyrene resin (B1-b) is prepared by protecting at least a part of alkali-soluble groups such as phenolic hydroxyl groups or carboxyl groups contained in the unprotected polyhydroxystyrene resin that is produced, for example, by the above method and is an intermediate of the polyhydroxystyrene resin (B1-b), by an acid-dissociative dissolution-controlling group. The alkali-soluble group protected by an acid-dissociative dissolution-controlling group may be introduced into the polyhydroxystyrene resin (B1-b) by polymerizing or copolymerizing a monomer containing an alkali-soluble group protected by the acid-dissociative dissolution-controlling group. The acid-dissociative dissolution-controlling group may be the same as described above in connection with the novolak resin (B-a).

The polyhydroxystyrene resin (B-b) may contain a polyhydroxystyrene resin (B2-b) as the second resin (B2) in addition to the polyhydroxystyrene resin (B1-b) as the first resin (B1). The polyhydroxystyrene resin (B2-b) is a polyhydroxystyrene resin insoluble in an aqueous basic solution having a pH value of 13 but soluble in an aqueous basic solution having a pH value of more than 13 and containing alkali-soluble groups with hydrogen atoms in at least a part thereof being substituted by an acid-dissociative dissolution-controlling group.

The solubility of the unprotected polyhydroxystyrene resin that is an intermediate of the polyhydroxystyrene resin (B2-b) in an aqueous basic solution can be regulated by regulating the content of units derived from hydroxystyrene compounds, regulating the molecular weight, or copolymerizing a hydroxystyrene compound and a carboxy group-containing monomer.

The polyhydroxystyrene resin (B-b) may contain a polyhydroxystyrene resin that is neither the polyhydroxystyrene resin (B1-b) nor the polyhydroxystyrene resin (B2-b).

[Acrylic Resin (B-c)]

The acrylic resin (B-c) contains an acrylic resin (B1-c) that is an acrylic resin soluble in an aqueous basic solution having a pH value of 12 and containing carboxyl groups with hydrogen atoms in at least a part thereof being substituted by an acid-dissociative dissolution-controlling group. The ratio of the mass of the acrylic resin (B1-c) to the mass of the acrylic resin (B-c) is more than 50% by mass.

The unprotected acrylic resin that may be an intermediate of the acrylic resin (B1-c) contains constituent units derived from a monomer containing a carboxyl group, the constituent units being contained in such an amount that the acrylic resin is soluble in an aqueous basic solution having a pH value of 12. Such carboxyl group-containing monomers include, for example, monocarboxylic acids such as acrylic acid, methacrylic acid and crotonic acid; dicarboxylic acids such as maleic acid, fumaric acid and itaconic acid; and methacrylic acid derivatives having a carboxyl group and an ester bond such as 2-methacryloyloxyethyl succinic acid, 2-methacryloyloxyethyl maleic acid 2-methacryloyloxyethyl phthalic acid and 2-methacryloyloxyethyl hexahydrophthalic acid. Among them, acrylic acid and methacrylic acid are preferred. The acrylic resin (B1-c) may be prepared by protecting the unprotected acrylic resin by an acid-dissociative dissolution-controlling group. The carboxyl group protected by an acid-dissociative dissolution-controlling group may be introduced into the acrylic resin (B1-c) by polymerizing or copolymerizing a monomer containing a carboxyl group protected by an acid-dissociative dissolution-controlling group. The acid-dissociative dissolution-controlling group is the same as described above in connection with the novolak resin (B-a).

Resins that satisfy the above requirements for the acrylic resin (B1-c) and include constituent units represented by the following formulae (b4) to (b6) are preferred as the acrylic resin (B1-c).

(b4)

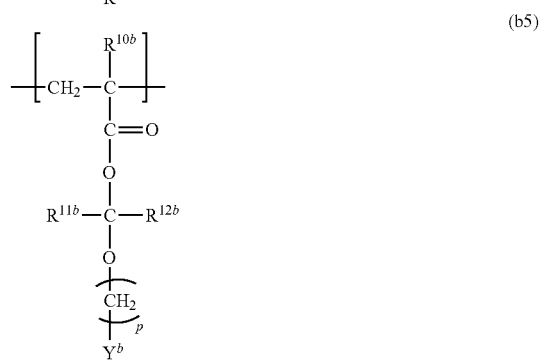

(b5)

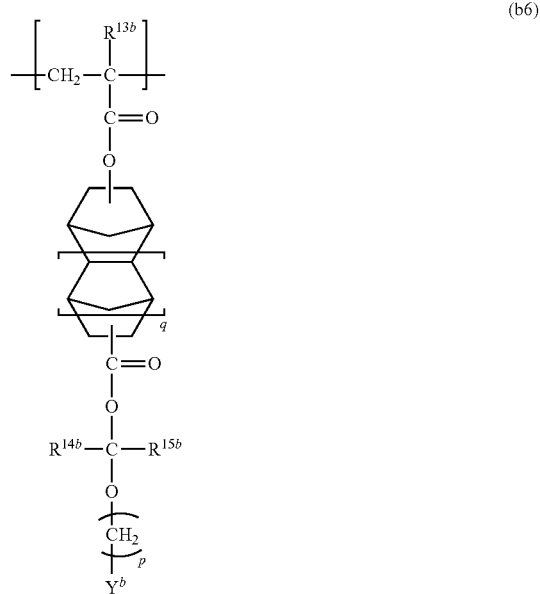

(b6)

In the formulae (b4) to (b6), $R^{6b}$ and $R^{10b}$ to $R^{15b}$ each independently represent a hydrogen atom, a linear or branched alkyl group having 1 to 6 carbon atoms, a fluorine atom or a linear or branched fluorinated alkyl group having 1 to 6 carbon atoms; $R^{7b}$ to $R^{7b}$ each independently represent a linear or branched alkyl group having 1 to 6 carbon atoms or a linear or branched fluorinated alkyl group having 1 to 6 carbon atoms; $R^{8b}$ and $R^{9b}$ may combine to form a hydrocarbon ring having 5 to 20 carbon atoms together with a carbon atom to which the both are attached; $Y^b$ represents an aliphatic cyclic group or an alkyl group optionally having a substituent; p is an integer of 0 to 4; and q is 0 or 1.

Examples of linear or branched alkyl groups include methyl, ethyl, propyl, isopropyl, n-butyl, isobutyl, tert-butyl, pentyl, isopentyl, and neopentyl groups. The fluorinated alkyl group refers to the above-described alkyl groups of which the hydrogen atoms are partially or entirely substituted with fluorine atoms.

When $R^{8b}$ and $R^{9b}$ do not combine to form a hydrocarbon ring, a linear or branched alkyl group having 2 to 4 carbon atoms is preferred as $R^{7b}$, $R^{8b}$ and $R^{9b}$, for example, from the viewpoints of high contrast, good resolution, and good focal depth-width. Preferably, $R^{11b}$, $R^{12b}$, $R^{14b}$, and $R^{15b}$ represent a hydrogen atom or a methyl group.

The $R^{8b}$ and $R^{9b}$ may form an aliphatic cyclic group having 5 to 20 carbon atoms together with a carbon atom to which the both are attached. Specific examples of such aliphatic cyclic groups include a group in which one or more hydrogen atoms are removed from monocycloalkane; and polycycloalkane such as bicycloalkane, tricycloalkane and tetracycloalkane. Specifically, they include a group in which one or more hydrogen atoms are removed from monocycloalkane such as cyclopentane, cyclohexane and cycloheptane; and polycycloalkane such as adamantane, norbornane, isobornane, tricyclodecane and tetracyclododecane; and the like. In particular, preferred is a group (optionally further having a substituent) in which one or more hydrogen atoms are removed from cyclohexane and adamantane.

Further, when an aliphatic cyclic group to be formed with the $R^{8b}$ and $R^{9b}$ has a substituent on the ring backbone thereof, examples of substituents include a polar group such as a hydroxy group, a carboxy group, a cyano group and an oxygen atom (=O), and a linear or branched alkyl group having 1 to 4 carbon atoms. As the polar group, an oxygen atom (=O) is particularly preferred.

The $Y^b$ is an alicyclic group or an alkyl group; and examples thereof are monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane, and polycycloalkanes such as adamantane, norbornane, isobornane, tricyclodecane and tetracyclododecane, from which at least one hydrogen atom is removed. Particularly preferred is adamantane from which at least one hydrogen atom is removed (that may further have a substituent).

When the alicyclic group of the $Y^b$ has a substituent on the ring skeleton, the substituent is exemplified by polar groups such as a hydroxide group, carboxyl group, cyano group and oxygen atom (=O), and linear or branched lower alkyl groups having 1 to 4 carbon atoms. The polar group is particularly preferably an oxygen atom (=O).

When $Y^b$ is an alkyl group, preferred are linear or branched alkyl groups having 1 to 20 carbon atoms, preferably 6 to 15 carbon atoms. The alkyl group is particularly preferably an alkoxyalkyl group; and examples of such alkoxyalkyl groups include 1-methoxyethyl, 1-ethoxyethyl, 1-n-propoxyethyl, 1-isopropoxyethyl, 1-n-butoxyethyl, 1-isobutoxyethyl, 1-tert-butoxyethyl, 1-methoxypropyl, 1-ethoxypropyl, 1-methoxy-1-methylethyl, and 1-ethoxy-1-methylethyl groups.

Specific examples of preferred constituent units represented by the formula (b4) include those represented by the following formulae (b4-1) to (b4-33).

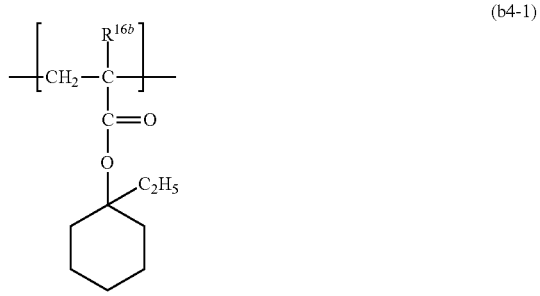

(b4-1)

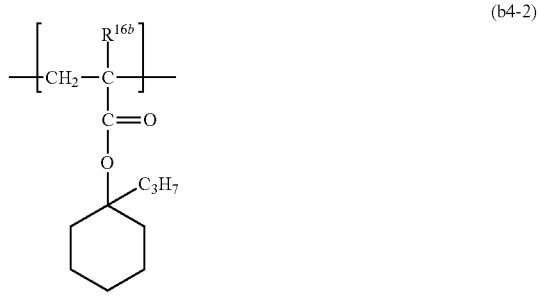

(b4-2)

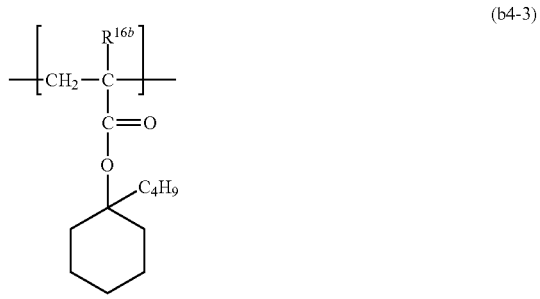

(b4-3)

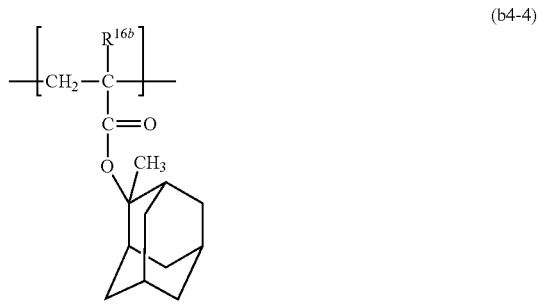

(b4-4)

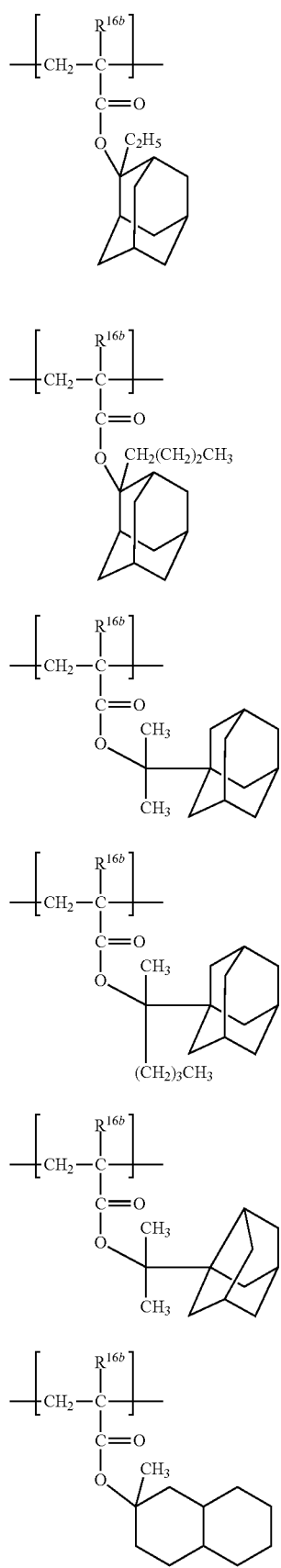
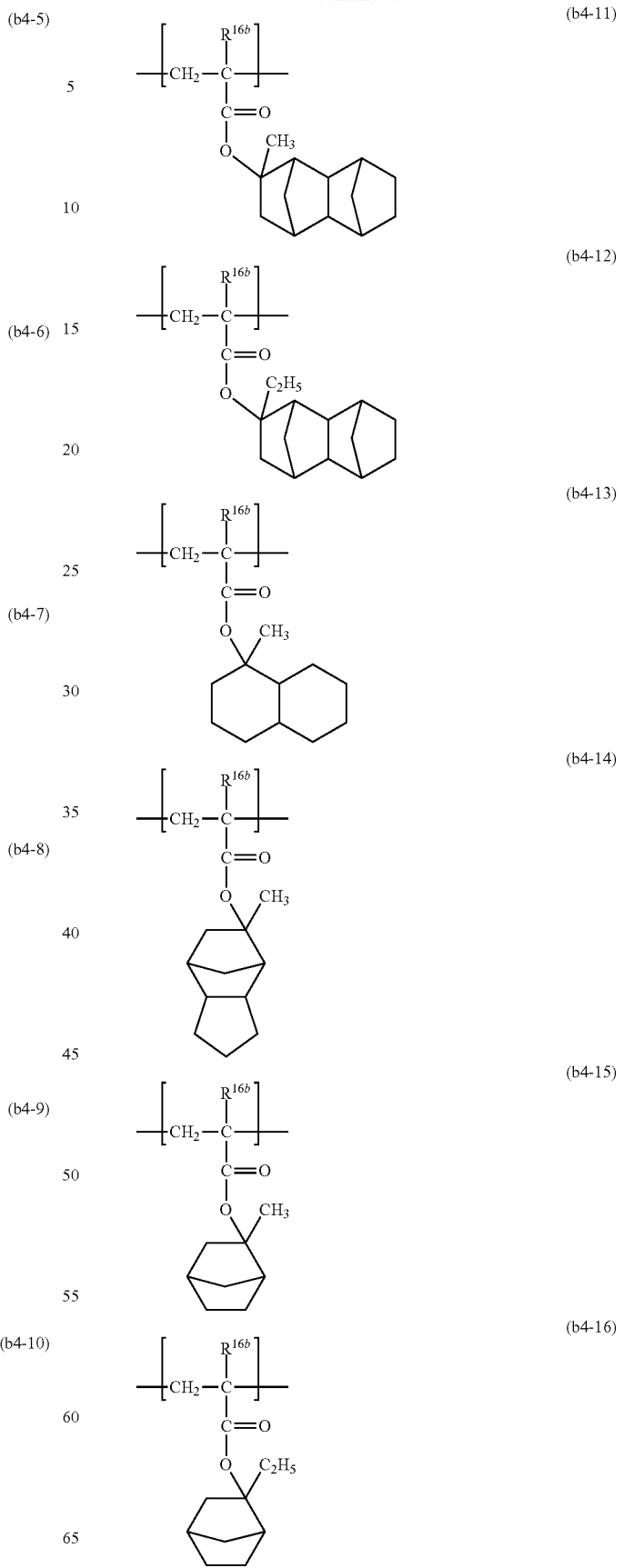

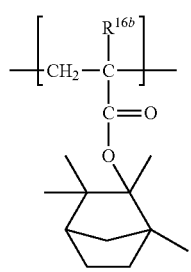
(b4-17)
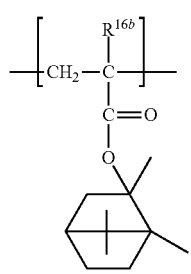
(b4-18)
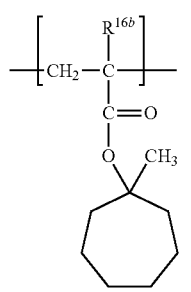
(b4-19)
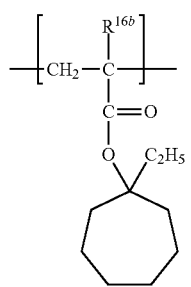
(b4-20)
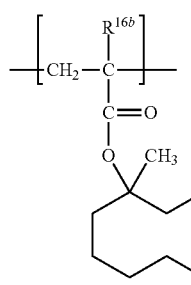
(b4-21)
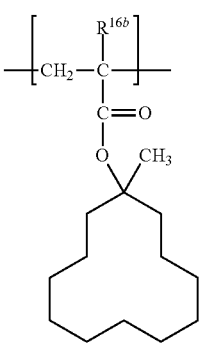
(b4-22)
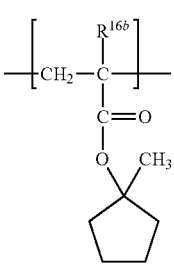
(b4-23)
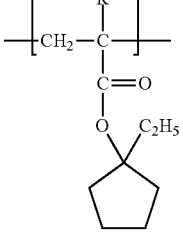
(b4-24)
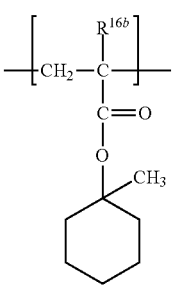
(b4-25)
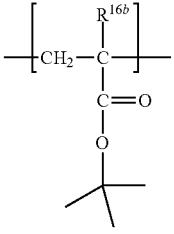
(b4-26)

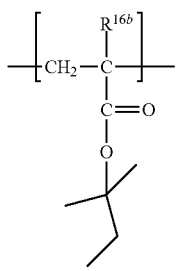
(b4-27)
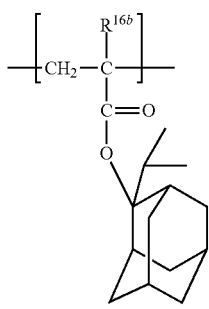
(b4-28)
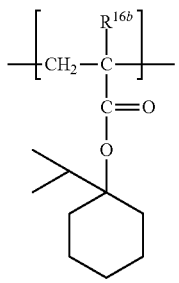
(b4-29)
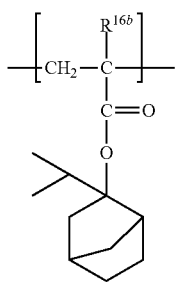
(b4-30)
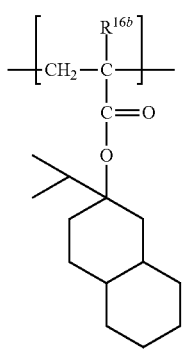
(b4-31)
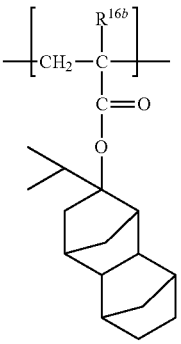
(b4-32)
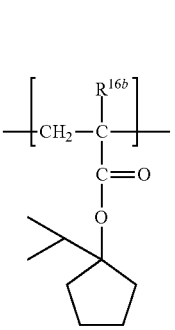
(b4-33)
In the formulae (b4-1) to (b4-33), $R^{16b}$ represents a hydrogen atom or a methyl group.
Specific examples of preferred constituent units represented by the formula (b5) include those represented by the following formulae (b5-1) to (b5-24).
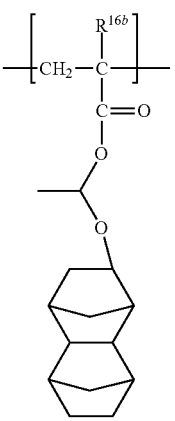
(b5-1)
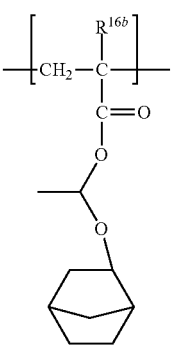
(b5-2)

(b5-3) 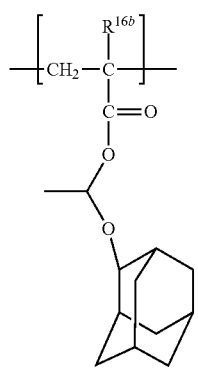
(b5-4) 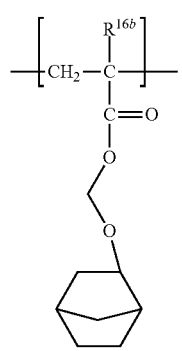
(b5-5) 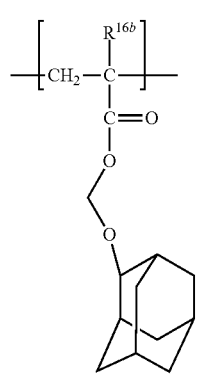
(b5-6) 
(b5-7) 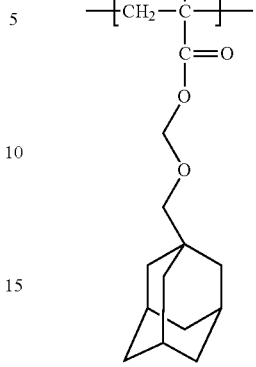
(b5-8) 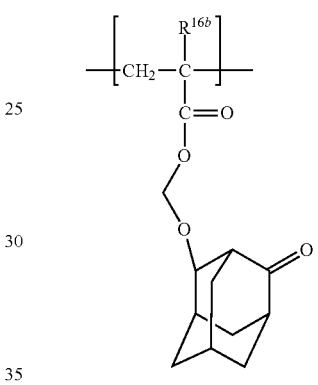
(b5-9) 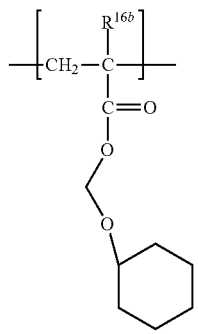
(b5-10) 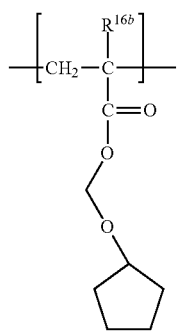

(b5-11)
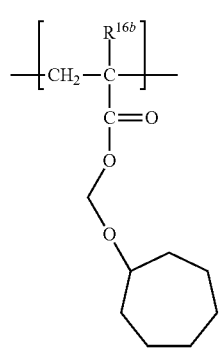
(b5-12)
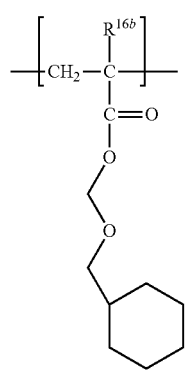
(b5-13)
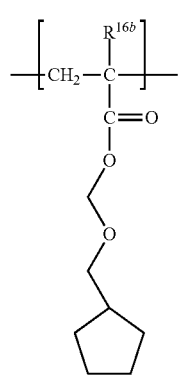
(b5-14)
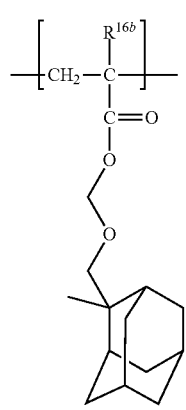
(b5-15)
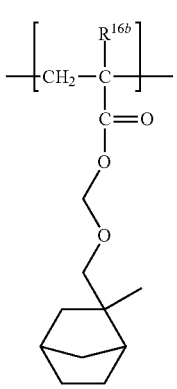
(b5-16)
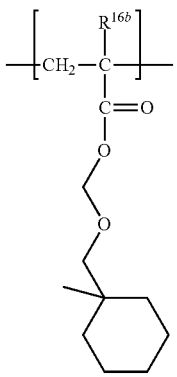
(b5-17)
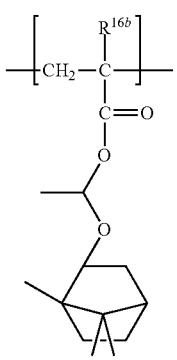
(b5-18)

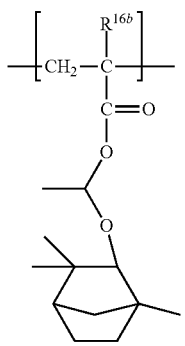 (b5-19)
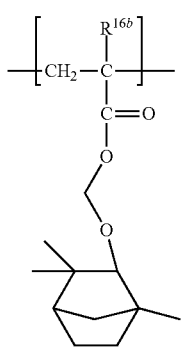 (b5-20)
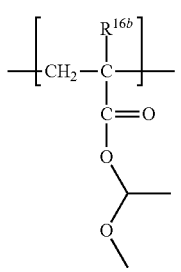 (b5-21)
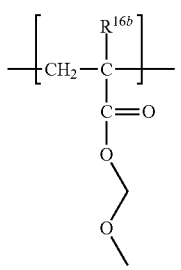 (b5-22)
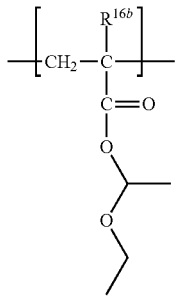 (b5-23)
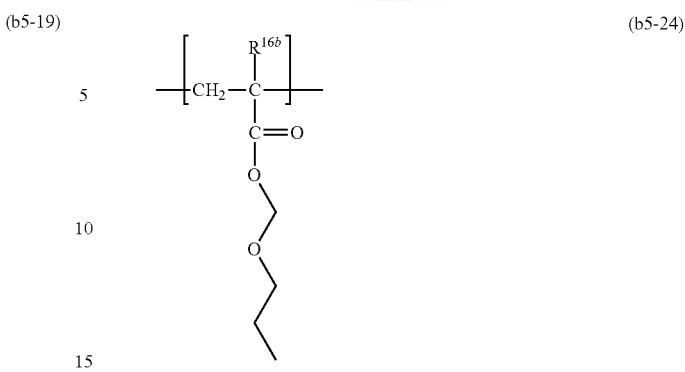
(b5-24)
In the formulae (b5-1) to (b5-24), Rift represents a hydrogen atom or a methyl group.
Specific examples of preferred constituent units represented by the formula (b6) include those represented by the following formulae (b6-1) to (b6-15).
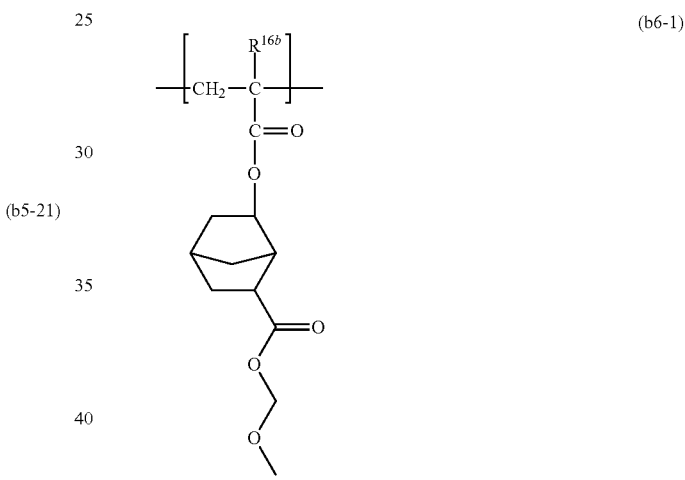
(b6-1)
(b6-2)

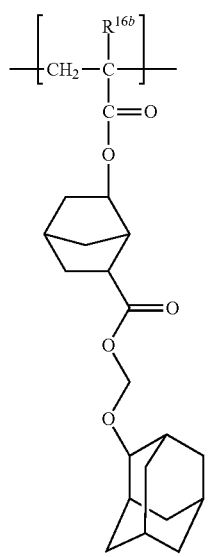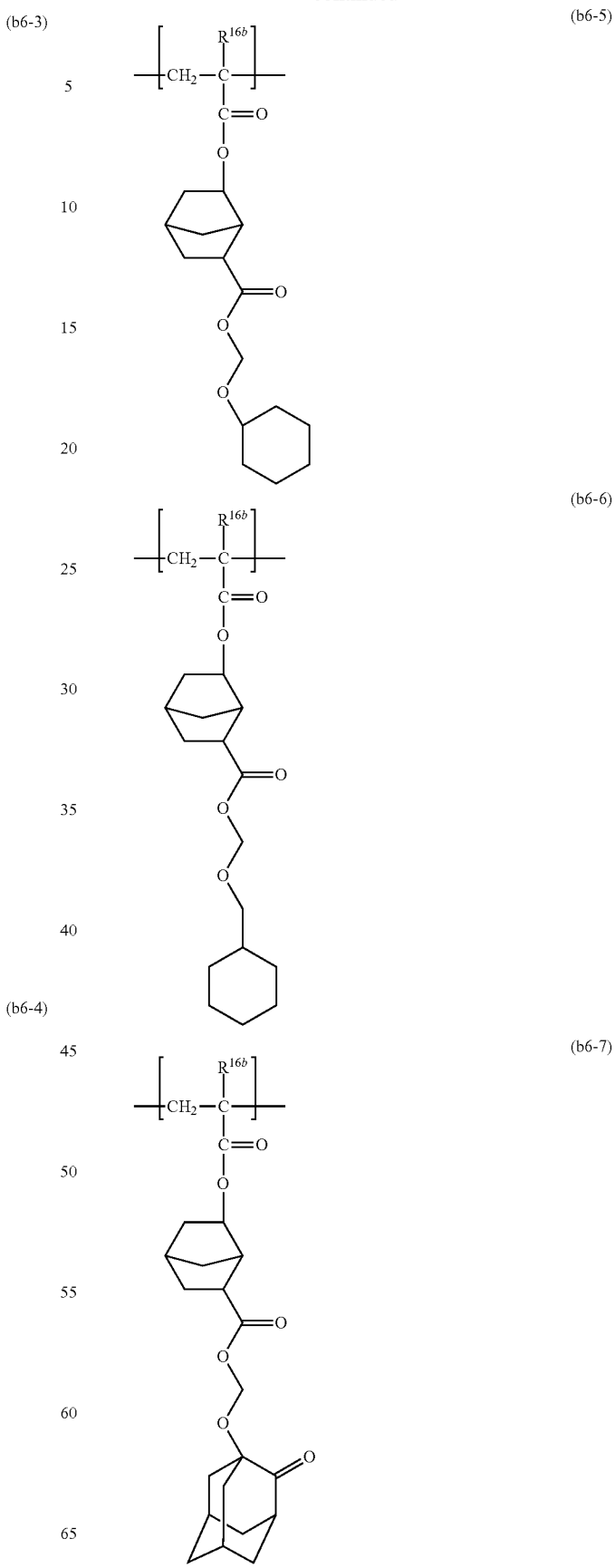

(b6-8)
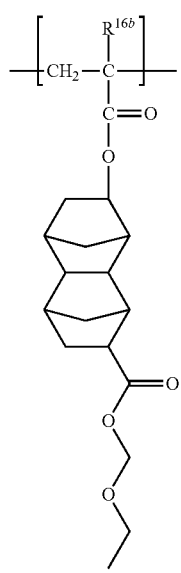
(b6-9)
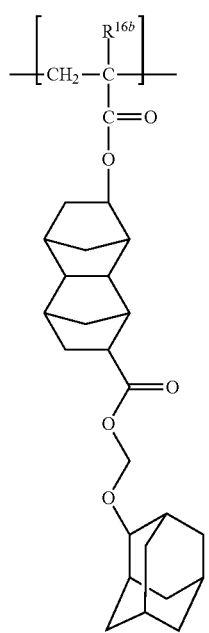
(b6-10)
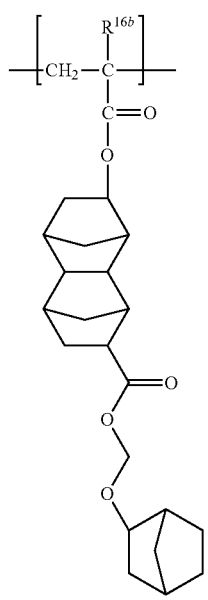
(b6-11)
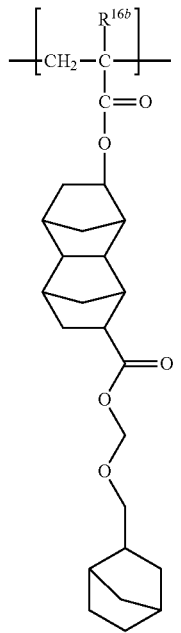

(b6-12)

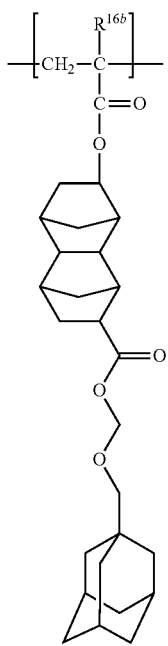

(b6-13)

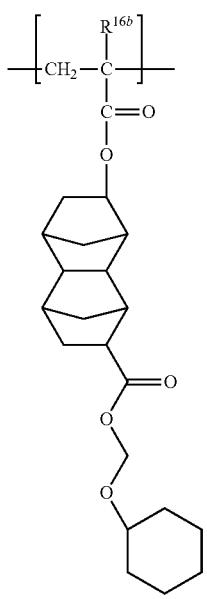

(b6-14)

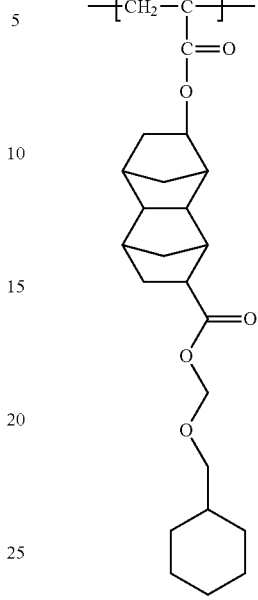

(b6-15)

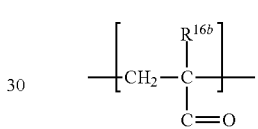

In the formulae (b6-1) to (b6-15), $R^{16b}$ represents a hydrogen atom or a methyl group.

The acrylic resin (B1-c) is preferably a resin comprising constituent units represented by the formulae (b4) to (b6) and further constituent units derived from an ether bond-containing polymerizable compound.

Examples of ether bond-containing polymerizable compounds include radical polymerizable compounds such as (meth)acrylic acid derivatives containing an ether bond and an ester bond, and specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)

acrylate, tetrahydrofurfuryl (meth)acrylate, and the like. Preferred ether bond-containing polymerizable compounds include 2-methoxyethyl (meth)acrylate, 2-ethoxyethyl (meth)acrylate, and methoxytriethylene glycol (meth)acrylate. These polymerizable polymerizable compounds may be used solely or in a combination of two or more of them.

Further, the acrylic resin (B1-c) may further contain other polymerizable compounds as constituent units from the viewpoint of properly regulating physical or chemical properties. Publicly known radical polymerizable compounds and anion polymerizable compounds may be mentioned as such polymerizable compounds.

Such polymerizable compounds include, for example, (meth)acrylic acid alkyl esters such as methyl(meth)acrylate, ethyl(meth)acrylate, butyl(meth)acrylate and cyclohexyl(meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

Examples of polymerizable compounds include (meth) acrylic acid esters having a non-acid-dissociative aliphatic polycyclic group, and vinyl group-containing aromatic compounds. For example, a tricyclodecanyl group, an adamantyl group, a tetracyclododecanyl group, an isobornyl group, or a norbornyl group is particularly preferred as the non-acid-dissociative aliphatic polycyclic group from the viewpoint of easy industrial availability. These aliphatic polycyclic groups may have a linear or branched alkyl group having 1 to 5 carbon atoms as the substituent.

Specific examples of (meth)acrylic acid esters having a non-acid-dissociative aliphatic polycyclic group include compounds having structures represented by the following formulae (b7-1) to (b7-5).

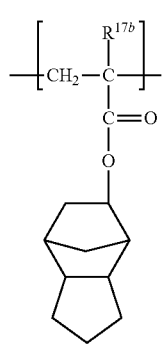
(b7-1)

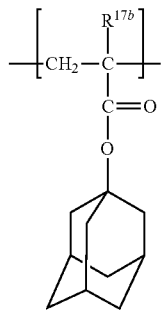
(b7-2)

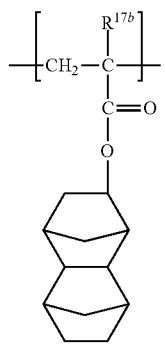
(b7-3)

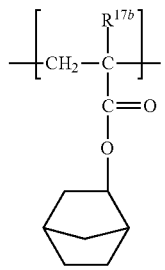
(b7-4)

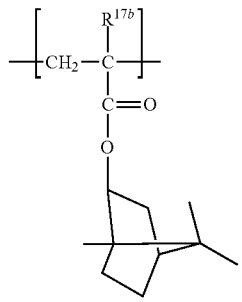
(b7-5)

In the formulae (b7-1) to (b7-5), $R^{17b}$ represents a hydrogen atom or a methyl group.

Among the resins (B), the acrylic resins (B3) are preferred. Among such acrylic resins (B3), a copolymer comprising constituent units represented by the formula (b5), constituent units derived from (meth)acrylic acid, constituent units derived from a (meth)acrylic acid alkyl ester, and constituent units derived from a (meth)acrylic acid aryl ester is preferred.

Such copolymers are preferably copolymers represented by the following formula (b8).

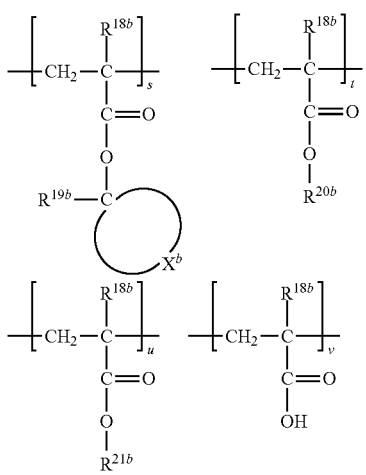

(b8)

In the formula (b8), $R^{18b}$ represents a hydrogen atom or a methyl; $R^{19b}$ represents a linear or branched alkyl group having 2 to 4 carbon atoms; $X^b$ represents a hydrocarbon ring having 5 to 20 carbon atoms formed together with a carbon atom to which it is attached; and $R^{20b}$ represents a linear or branched alkyl group having 1 to 6 carbon atoms or an alkoxyalkyl group having 1 to 6 carbon atoms.

In the copolymer represented by the formula (b8), s, t, u, and v each independently represent the molar ratio of the constituent units, wherein s is 30 to 50% by mole, t is 5 to 35% by mole, u is 5 to 35% by mole, and v is 10 to 30% by mole.

The acrylic resin (B-c) may contain an acrylic resin (B2-c) as the second resin (B2) in addition to the acrylic resin (B1-c) as the first resin (B1). The acrylic resin (B2-c) is an acrylic resin insoluble in an aqueous basic solution having a pH value of 13 but soluble in an aqueous basic solution having a pH value of more than 13 and containing carboxy groups with hydrogen atoms in at least a part thereof being substituted by an acid-dissociative dissolution-controlling group.

The solubility of the unprotected acrylic resin that may be an intermediate of the acrylic resin (B2-c) in an aqueous basic solution can be regulated by regulating the content of units derived from the carboxy group-containing monomer.

The acrylic resin (B-c) may contain an acrylic resin that is neither the acrylic resin (B1-c) nor the acrylic resin (B2-c).

The mass average molecular weight of the resin (B) in terms of polystyrene is preferably 10,000 to 600,000, more preferably 20,000 to 400,000, still more preferably 30,000 to 300,000. When the mass average molecular weight is in the above-defined range, the photosensitive resin film can maintain a sufficient strength without lowering in separatability from the surface of the substrate and cracking can be prevented.

Preferably, the resin (B) has a dispersivity of not less than 1.05. Here the dispersivity is a value obtained by dividing the mass average molecular weight by the number average molecular weight.

The content of the resin (B) is preferably 5 to 60% by mass relative to the total mass of the photosensitive rein composition.

<Alkali-Soluble Resin (C)>

The positive-type composition may contain an alkali-soluble resin (C) in addition to the resin (B). The alkali-soluble resin (C) is different from the resin (B) in that the solubility in an alkali does not substantially increase by the action of an acid. The incorporation of the alkali-soluble resin (C) in the positive-type composition is likely to contribute to an improvement in crack resistance of a resist film formed using the positive-type composition.

The alkali-soluble resin refers to one that satisfies the requirement that, when a 1 μm-thick resin film is formed on a substrate using a resin solution having a resin concentration of 20% by mass (solvent: propylene glycol monomethyl ether acetate) and is immersed in a 2.38% by mass aqueous TMAH solution for one min, a thickness of not less than 0.01 μm is dissolved. The alkali-soluble resin (C) is preferably at least one resin selected from the group consisting of novolak resins (C1), polyhydroxystyrene resins (C2), and acrylic resins (C3).

[Novolak Resin (C1)]

The novolak resin (C1) is obtained, for example, by subjecting an aromatic compound containing a phenolic hydroxyl group (hereinafter referred to simply as a "phenol compound") and an aldehyde compound to addition condensation in the presence of an acid catalyst.

Examples of phenol compounds include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like. Examples of aldehyde compounds include formaldehyde, furfural, benzaldehyde, nitrobenzaldehyde, acetaldehyde, and the like. The catalyst used in the addition condensation reaction, which is not specifically limited, is exemplified by hydrochloric acid, nitric acid, sulfuric acid, formic acid, oxalic acid, acetic acid, etc., in regards to acid catalyst.

The flexibility of the novolak resins can be enhanced still more when o-cresol is used, when a hydrogen atom of a hydroxide group in the resins is substituted by other substituents, or when bulky aldehydes are used.

The mass average molecular weight of novolak resin (C1) is not particularly limited as long as the purpose of the present invention is not impaired, but the mass average molecular weight is preferably 1,000 to 50,000.

[Polyhydroxystyrene Resin (C2)]

For example, p-hydroxystyrene, α-methylhydroxystyrene, and α-ethylhydroxystyrene may be mentioned as hydroxystyrene-based compounds that constitute the polyhydroxystyrene resin (C2). Further, the polyhydroxystyrene resin (C2) is preferably a copolymer with a styrene resin. Styrene-based compounds that constitute the styrene resin include styrene, chlorostyrene, chloromethylstyrene, vinyltoluene, and α-methylstyrene.

The mass average molecular weight of the polyhydroxystyrene resin (C2) is not particularly limited as long as the purpose of the present invention is not impaired, but the mass average molecular weight is preferably 1,000 to 50,000.

[Acrylic Resin (C3)]

Preferably, the acrylic resin (C3) includes constituent units derived from an ether bond-containing polymerizable compound and constituent units derived from a carboxy group-containing polymerizable compound.

Examples of ether bond-containing polymerizable compounds include (meth)acrylic acid derivatives having an ether bond and an ester bond, such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and the like. The polymerizable compound having an ether linkage is preferably, 2-methoxyethyl acrylate, and methoxytriethylene glycol acrylate. The polymerizable compound having an ether linkage is preferably, 2-methoxyethyl acrylate, and methoxytriethylene glycol acrylate. These polymerizable compounds may be used solely or in a combination of two or more of them.

Examples of polymerizable compounds having a carboxy group include monocarboxylic acids such as acrylic acid, methacrylic acid and crotonic acid; dicarboxylic acids such as maleic acid, fumaric acid and itaconic acid; compounds having a carboxy group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid. The polymerizable compound having a carboxy group is preferably, acrylic acid and methacrylic acid. These polymerizable compounds may be used solely or in a combination of two or more of them.

The mass average molecular weight of the acrylic resin (C3) is not particularly limited as long as the purpose of the present invention is not impaired, but the mass average molecular weight is preferably 50,000 to 80,000.

The content of the alkali-soluble resin (C) is preferably 0 to 80 parts by mass, more preferably 0 to 60 parts by mass when the total content of the resin (B) and the alkali-soluble resin (C) is presumed to be 100 parts by mass. When the content of the alkali-soluble resin (C) is in the above-defined range, there is a tendency that the resistance to cracking is increased and film loss at the time of development can be prevented.

<Acid Diffusion Control Agent (D)>

In order to improve the resist pattern configuration, the post-exposure delay stability and the like, preferably the photosensitive resin composition further contains an acid diffusion control agent (D). The acid diffusion control agent (D) is preferably a nitrogen-containing compound (D1), and an organic carboxylic acid or an oxo acid of phosphorus or a derivative thereof (D2) may be further incorporated as needed.

[Nitrogen-Containing Compound (D1)]

Examples of nitrogen-containing compounds (D1) include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri (2-pyridyl)-S-triazine, morpholine, 4-methylmorpholine, piperazine, 1,4-dimethylpiperazine, 1,4-diazabicyclo[2.2.2]octane, pyridine and the like. They may be used solely or in a combination of two or more of them.

The nitrogen-containing compound (D1) may be used in an amount typically in the range of 0 to 5 parts by mass, and particularly in the range of 0 to 3 parts by mass, relative to 100 parts by mass in total of the resin (B) and the alkali-soluble resin (C).

[Organic Carboxylic Acid or Oxo Acid of Phosphorus or Derivative Thereof (D2)]

Among the organic carboxylic acids or the oxo acid of phosphorus or the derivative thereof (D2), specific examples of preferred organic carboxylic acids include malonic acid, citric acid, malic acid, succinic acid, benzoic acid, salicylic acid and the like, and salicylic acid is particularly preferred.

Examples of the oxo acid of phosphorus or derivatives thereof include phosphoric acid and derivatives such as esters thereof such as, e.g., phosphoric acid, phosphoric acid di-n-butyl ester, and phosphoric acid diphenyl ester; phosphonic acid and derivatives such as esters thereof such as, e.g., phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as, e.g., phosphinic acid and phenylphosphinic acid; and the like. Among these, phosphonic acid is particularly preferred. They may be used solely or in a combination of two or more of them.

The organic carboxylic acid or the oxo acid of phosphorus or the derivative thereof (D2) may be used in an amount typically in the range of 0 to 5 parts by mass, and particularly in the range of 0 to 3 parts by mass, relative to 100 parts by mass in total of the resin (B) and the alkali-soluble resin (C).

Moreover, in order to form a salt for stabilization purposes, the organic carboxylic acid or the oxo acid of phosphorous or the derivative thereof (D2) is preferably used in an amount equivalent to that of the nitrogen-containing compound (D1).

<Organic Solvent (S)>

The photosensitive resin composition contains an organic solvent (S). The kind of the organic solvent (S) is not particularly limited as long as the purpose of the present invention is not impaired, and the organic solvent can be appropriately selected for use from the organic solvents that have been conventionally used in positive-type photosensitive resin compositions.

Specific examples of the organic solvent (S) include ketones such as acetone, methyl ethyl ketone, cyclohexanone, methyl isoamyl ketone, and 2-heptanone; polyhydric alcohols and derivatives thereof, like monomethyl ethers, monoethyl ethers, monopropyl ethers, monobutyl ethers and monophenyl ethers, such as ethylene glycol, ethylene glycol monoacetate, diethylene glycol, diethylene glycol monoacetate, propylene glycol, propylene glycol monoacetate, dipropylene glycol and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, methyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate and 3-methyl-3-methoxybutyl acetate; aromatic hydrocarbons such as toluene and xylene; and the like. They may be used solely or in a combination of two or more of them.

The content of the organic solvent (S) is not particularly limited as long as the purpose of the present invention is not impaired. When the positive-type resin composition is used for a thick-film application in which a photosensitive resin film obtainable by a spin-coating method or the like has a film thickness of 10 μm or greater, it is preferable to use the organic solvent (S) to the extent that the solid concentration of the photosensitive resin composition is 30% to 55% by mass.

<Other Ingredients>

The positive-type resin composition may further contain a polyvinyl resin for plasticity improvement purposes. Specific examples of polyvinyl resins include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof, and the like. The polyvinyl resin is preferably polyvinyl methyl ether in view of lower glass transition temperatures.

Further, the positive-type resin composition may also contain an adhesive auxiliary agent in order to improve the adhesiveness between a patterned resist film formed using the positive-type composition and a substrate.

Further, the positive-type composition may further contain a surfactant from the viewpoint of improving coating characteristics, defoaming characteristics, leveling characteristics and the like. Specific examples of surfactants include commercially available fluorochemical surfactants such as BM-1000 and BM-1100 (both manufactured by B.M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.), but not limited thereto.

Additionally, in order to finely adjust the solubility in a developing solution, the positive-type resin composition may further contain an acid, an acid anhydride, or a solvent having a high boiling point.

Specific examples of acids and acid anhydrides include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic acid, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate; and the like.

Furthermore, specific examples of the solvent having a high boiling point include N-methylformamide, N,N-dimethylformamide, N-methylformanilide, N-methylacetamide, N,N-dimethlyacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, y-butyrolactone, ethylene carbonate, propylene carbonate, phenyl cellosolve acetate, and the like.

Moreover, the positive-type resin composition may further contain a sensitizer for sensitivity improvement purposes.

<Method for Preparing Chemically Amplified Positive-Type Photosensitive Resin Composition>

The positive-type resin composition is prepared by mixing and stirring the above ingredients by an ordinary method. Machines which can be used for mixing and stirring the above ingredients include dissolvers, homogenizers, 3-roll mills and the like. After uniformly mixing the above ingredients, the resultant mixture may further be filtered through a mesh, a membrane filter and the like.

<<Substrate with Photosensitive Film>>

The substrate with a photosensitive film includes a photosensitive film formed of the positive-type composition on a substrate. The photosensitive film may be provided on the substrate by any method without particular limitation. The photosensitive film may be formed, for example, by coating a positive-type composition on a substrate with a spinner and then drying the coating. Alternatively, the photosensitive film may be provided on the substrate by applying, on a substrate, a photosensitive dry film prepared using the positive-type composition according to an ordinary method. The thickness of the photosensitive film is not particularly limited and may be properly determined depending upon applications of resist patterns formed using the photosensitive film. The thickness of the photosensitive film is 1 to 150 µm, preferably 1 to 20 µm, more preferably 3 to 10 µm.

The substrate may be formed of any material without particular limitation. The material may be an inorganic material Si, Cu, Au, or glass, or an organic material such as a resin. The substrate is preferably formed of a resin material from the viewpoints of a reduction in production cost of multi-chip modules such as MCPs (multi chip packages) and SiPs (system in packages) and easy mounting of IC chips on interposers. The substrate with a photosensitive film, the substrate being a resin, is suitable as interposers for IC chip mounting used in the manufacture of multi-chip modules.

<<Method for Patterned Resist Film Formation>>

The method for patterned resist film formation comprises: subjecting a photosensitive film formed of a chemically amplified positive-type photosensitive resin composition according to position-selective exposure; and developing the exposed photosensitive film.

The photosensitive film is generally formed on a substrate. The material for the substrate, the method for photosensitive film formation, and the thickness of the photosensitive film are the same as described above in connection with the substrate with a photosensitive film.

The photosensitive film thus formed is subjected to position-selective exposure according to a desired pattern shape. The position-selective exposure may be carried out, for example, by a method in which the film is exposed to light through a light-shielding mask. Low pressure mercury lamps, high pressure mercury lamps, ultrahigh pressure mercury lamps, metal halide lamps, argon gas lasers, etc. can be used as light sources of the radiation. Radiations include micro waves, infrared rays, visible lights, ultraviolet rays, X-rays, g-rays, electron beams, proton beams, neutron beams, ion beams, etc. The irradiation dose of the radiation may vary depending upon the ingredients of the positive-type composition, the film thickness of the photosensitive resin layer, and the like. For example, when an ultrahigh-pressure mercury lamp is used, the dose may be 100 to 10,000 mJ/cm$^2$. The radiation includes a light ray to activate the acid generator (A) in order to generate an acid.

After exposure, the photosensitive film is heated by a publicly known method to promote the diffusion of the acid and thus to allow the solubility of exposed areas in the photosensitive film in alkali to be varied.

The exposed photosensitive film is developed. The type of the developing solution is not particularly limited, and various aqueous basic solutions that have hitherto been used as a developing solution for resist pattern formation may be used as the developing solution.

Preferably, aqueous basic solutions having a low pH value (for example, a pH value of not more than 12) are used as the developing solution from the viewpoints of easy diversion of facilities and liquid chemicals for resist pattern formation using negative-type photosensitive compositions as such. Aqueous sodium carbonate solutions are preferred as the aqueous basic solution having low pH. Preferably, the aqueous sodium carbonate solution has a sodium carbonate concentration of not more than 5% by mass.

The development is carried out, for example, at a temperature of 20 to 30° C. The patterned resist film after the development is rinsed with pure water or the like and then dried. After the development, the patterned resist film may be baked (post-baked).

According to the above method, since the above positive-type composition is used, good development is possible even when the development is carried out with aqueous basic solutions having low pH.

EXAMPLES

Below, the present invention will be described in more detail with reference to Examples, but the present invention shall not be limited to these Examples.

In the following Examples, resins B1 to B4 prepared in the following Preparation Examples 1 to 4 and a resin B5 having the following structure were used as the resin (B). The number at the lower right of the parentheses in each constituent unit contained in the resin B5 represents the content (% by mass) of the constituent unit in the resin B5. Their resin obtained by removing an acid-dissociative dissolution-controlling group in the resin B5 was soluble in an aqueous basic solution having pH 12. In Comparative Examples, resins B6 and B7 obtained in the following Preparation Examples 5 and 6 were used.

<Resin B5>

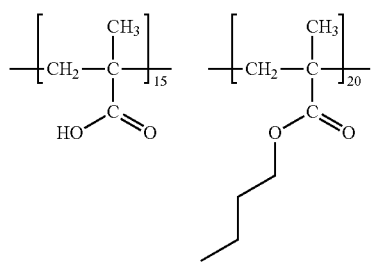

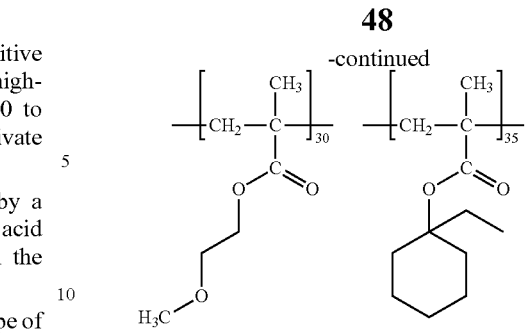

Preparation Example 1

465 g of an aqueous formalin solution having a concentration of 37% by mass and 2 g of oxalic acid were added to 1,000 g of phenol in a reaction vessel. The contents of the reaction vessel were heated to reflux, and a polymerization reaction was carried out under reflux until the molecular weight reached a predetermined value. The reaction vessel was then heated under the atmospheric pressure to an internal pressure of 170° C. to dehydrate the contents of the reaction vessel. The reaction vessel was further heated under reflux of the contents thereof to 200° C. to remove water and residual monomers from the contents. The contents of the reaction vessel were recovered to obtain a novolak resin having a mass average molecular weight of 2,000 (NV1). NV1 was soluble in an aqueous basic solution having a pH value of 12.

The NV1 was subjected to an addition reaction with ethyl vinyl ether in the presence of an acid catalyst followed by purification to obtain resin B1 that is a novolak resin having a percentage addition of 20%. The percentage addition after the purification is a ratio (% by mole) of the number of moles of hydroxyl groups protected by the addition of ethyl vinyl ether to the total of the number of moles of phenolic hydroxyl gropes and the number of moles of hydroxyl groups produced by the addition of ethyl vinyl ether (1-ethoxyethoxy group).

Preparation Example 2

A resin B2 that is a novolak resin having hydroxyl groups protected by the addition of ethyl vinyl ether was obtained in the same manner as in Example 1, except that the percentage addition after the purification was changed from 20% to 30%.

Preparation Example 3

A novolak resin having a mass average molecular weight of 9,000 (NV2) was obtained in the same manner as in Preparation Example 1, except that the polymerization reaction time in the preparation of NV1 was extended. NV2 was soluble in an aqueous basic solution having a pH value of 12. The NV2 was subjected to an addition reaction with ethyl vinyl ether in the presence of an acid catalyst followed by purification to obtain resin B3 that is a novolak resin having a percentage addition of 20%.

Preparation Example 4

A resin B4 that is a novolak resin having hydroxyl groups protected by the addition of ethyl vinyl ether was obtained in the same manner as in Preparation Example 3, except that the percentage addition after the purification was changed from 20% to 30%.

Preparation Example 5

The reaction vessel was charged with 100 g of a mixture composed of m-cresol, p-cresol, and o-cresol (mass ratio of m-cresol:p-cresol:o-cresol=30:20:50).

465 g of an aqueous formalin solution having a concentration of 37% by mass and 2 g of oxalic acid were added to the reaction vessel. The contents of the reaction vessel were heated to reflux, and a polymerization reaction was carried out under reflux until the molecular weight reached a predetermined value. The reaction vessel was then heated under the atmospheric pressure to an internal pressure of 170° C. to dehydrate the contents of the reaction vessel. The reaction vessel was further heated under reflux of the contents thereof to 200° C. to remove water and residual monomers from the contents. The contents of the reaction vessel were recovered to obtain a novolak resin having a mass average molecular weight of 4200 (NV3). NV3 was insoluble in an aqueous basic solution having a pH value of 12.

The NV3 was subjected to an addition reaction with ethyl vinyl ether in the presence of an acid catalyst followed by purification to obtain a resin B6 that is a novolak resin having a percentage addition of 20%.

Preparation Example 6

A novolak resin having a mass average molecular weight of 4400 (NV4) was obtained in the same manner as in the preparation of NV3 in Preparation Example 5, except that the mixture composed of m-cresol, p-cresol, and o-cresol was changed to a mixture composed of m-cresol, p-cresol, 2,4-xylenol, and 2,5-xylenol (mass ratio of m-cresol:p-cresol:2,4-xylenol:2,5-xylenol=55:35:3:7). NV4 was insoluble in an aqueous basic solution having a pH value of 12.

The NV4 was subjected to an addition reaction with ethyl vinyl ether in the presence of an acid catalyst followed by purification to obtain resin B7 that is a novolak resin having a percentage addition of 20%.

Examples 1 to 5 and Comparative Examples 1 and 2

Chemically amplified positive-type photosensitive resin compositions of individual Examples and Comparative Examples were prepared by dissolving 100 parts by mass of a resin of the type specified in Table 1, 0.3 part by mass of a photoacid generator having the following structure, and 0.05 part by mass of a surfactant (BYK-310, a silicone-based surfactant, manufactured by BYK-Chemie Japan KK) in propylene glycol monomethyl ether acetate to give a solution having a solid content concentration of 35% by mass.
<Photoacid Generator>

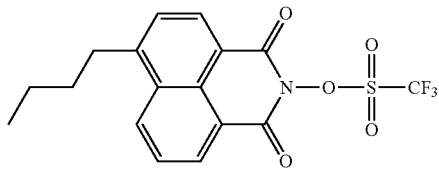 [SMILES: CCCCc1ccc2c3c(cccc13)C(=O)N(OS(=O)(=O)C(F)(F)F)C2=O]

A positive-type photoresist composition was coated with a spinner on a Cu substrate to form a coating film. The coating film was dried at 100° C. for 240 sec to form a photosensitive film having a thickness of 5 μm. The photosensitive film was exposed to a ghi radiation with Prisma GHI5452 (manufactured by Ultratech) through a mask for line-and-space pattern formation. The substrate was mounted on a hot plate, and the exposed photosensitive film was subjected to post-exposure baking (PEB) at 85° C. for 180 sec. After PEB, the exposed photosensitive film was immersed in an aqueous sodium carbonate solution having a concentration of 1.5% by mass at 23° C. for 120 sec, was then rinsed with water for 30 sec, and was dried to obtain a resist pattern. The resist pattern thus obtained was microscopically observed, and, when a line-and-space pattern having a predetermined dimension was resolved, the sample was regarded as "Good" while, when a line-and-space pattern having a predetermined dimension was not resolved, the sample was regarded as "Poor".

TABLE 1

| | Type of resin | Developability (1.5 mass % aqueous Na$_2$CO$_3$ solution) |
|---|---|---|
| Example 1 | B1 | Good |
| Example 2 | B2 | Good |
| Example 3 | B3 | Good |
| Example 4 | B4 | Good |
| Example 5 | B5 | Good |
| Comparative Example 1 | B6 | Poor |
| Comparative Example 2 | B7 | Poor |

It was found from the Examples that, when the chemically amplified positive-type photosensitive resin composition contains, as a resin (B), a predetermined amount or a larger amount of a first resin (B1) that is an alkali-soluble resin soluble in an aqueous basic solution having a pH value of 12 and containing alkali-soluble groups with hydrogen atoms in at least a part thereof being substituted by an acid-dissociative dissolution-controlling group, good development is possible even when the development is carried out with a 1.5 mass % aqueous Na$_2$CO$_3$ solution having a low pH value.

On the other hand, it was found from the Comparative Examples that, when a chemically amplified positive-type photosensitive resin composition containing, as a resin (B), a resin that is an alkali-soluble resin insoluble in an aqueous basic solution having a pH value of 12 and containing alkali-soluble groups with hydrogen atoms in at least a part thereof being substituted by an acid-dissociative dissolution-controlling group, good development is impossible when a 1.5 mass % aqueous Na$_2$CO$_3$ solution is used.

What is claimed is:
1. A chemically amplified positive photosensitive resin composition comprising:
an acid generator (A) that produces an acid upon irradiation with an active ray or radiation;
a resin (B) whose solubility in alkali increases under the action of acid; and
an organic solvent (S),
wherein the resin (B) comprises a first resin (B1) which is a protected resin containing alkali-soluble groups in which at least some of the hydrogen atoms are substituted with an acid-dissociative dissolution-controlling group, and when the protected resin is unprotected or deprotected, the unprotected or deprotected resin is an alkali-soluble resin soluble in an aqueous basic solution having a pH value of 12, wherein the ratio of the mass of the first resin (B1) to the mass of the resin (B) is more than 50%, and wherein the acid generator (A) is a trifluoromethane sulfonate of N-hydroxyphthalimide having a butyl group or N-hydroxynaphthalimide having a butyl group.

2. The chemically amplified positive photosensitive resin composition according to claim 1, wherein:

the resin (B) is a novolak resin; and the first resin (B1) is a novolak resin comprising phenol-derived units containing phenolic hydroxyl groups, wherein at least a part of hydrogen atoms in the phenolic hydroxyl groups are substituted with an acid-dissociative dissolution-controlling group.

3. A substrate with a photosensitive film, comprising:

a substrate; and a photosensitive film formed from the chemically amplified positive photosensitive resin composition according to claim 1 which is provided on the substrate.

4. A method of forming a patterned resist film, the method comprising:

subjecting a photosensitive film formed of the chemically amplified positive photosensitive resin composition according to claim 1 to position-selective exposure; and developing the exposed photosensitive film to form the patterned resist film, wherein the position-selective exposure comprises exposing the photosensitive film to an active ray or radiation through a light-shielding mask.

5. The method for patterned resist film formation according to claim 4, wherein the development is carried out with an aqueous basic solution having a pH of 12 or less.

6. The chemically amplified positive photosensitive resin composition according to claim 1, wherein the resin (B) comprises a novolak resin, and the first resin (B1) is a novolak resin consisting of phenol-derived units containing hydroxyl groups, and wherein at least some of the hydrogen atoms of the phenolic hydroxyl groups are substituted with an acid-dissociative dissolution-controlling group.

7. The chemically amplified positive photosensitive resin composition according to claim 1, wherein the protected resin is polyhydroxystyrene resin (B1-b) which is produced by protecting an alkali-soluble group contained in an unprotected polyhydroxystyrene resin with an acid-dissociative dissolution-controlling group or a polymer or copolymer of a monomer having an alkali-soluble group protected with an acid-dissociative dissolution-controlling group.

8. The chemically amplified positive photosensitive resin composition according to claim 1, wherein the protected resin is acrylic resin (B1-c), which is produced by protecting an unprotected acrylic resin with an acid-dissociative dissolution-controlling group or a polymer or copolymer of a monomer having a carboxyl group protected with an acid-dissociative dissolution-controlling group.

9. The chemically amplified positive photosensitive resin composition according to claim 1 consisting essentially of:

the acid generator (A) that produces an acid upon irradiation with an active ray or radiation;

the resin (B) whose solubility in alkali increases under the action of acid;

the organic solvent (S); and a surfactant.

* * * * *